(12) United States Patent
Kim et al.

(10) Patent No.: US 10,847,464 B2
(45) Date of Patent: Nov. 24, 2020

(54) SEMICONDUCTOR DEVICE INCLUDING CONDUCTIVE STRUCTURE HAVING NUCLEATION STRUCTURE AND METHOD OF FORMING THE SAME

(71) Applicant: SAMSUNG ELECTRONICS CO., LTD., Suwon-si (KR)

(72) Inventors: Tae Yeol Kim, Hwaseong-si (KR); Ji Won Kang, Seoul (KR); Chung Hwan Shin, Hwaseong-si (KR); Jin Il Lee, Seongnam-si (KR); Sang Jin Hyun, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 16/738,754

(22) Filed: Jan. 9, 2020

(65) Prior Publication Data

US 2020/0152577 A1 May 14, 2020

Related U.S. Application Data

(63) Continuation of application No. 16/441,433, filed on Jun. 14, 2019, now Pat. No. 10,580,736, which is a (Continued)

(30) Foreign Application Priority Data

Jan. 25, 2017 (KR) .................. 10-2017-0011965

(51) Int. Cl.
*H01L 23/532* (2006.01)
*H01L 23/528* (2006.01)
(Continued)

(52) U.S. Cl.
CPC ...... *H01L 23/53266* (2013.01); *B24B 37/042* (2013.01); *C23C 16/45527* (2013.01);
(Continued)

(58) Field of Classification Search
CPC .................. H01L 21/76877–76883; H01L 21/76802–76817; H01L 21/768–76898;
(Continued)

(56) References Cited

U.S. PATENT DOCUMENTS 6,607,976 B2 8/2003 Chen et al.
6,703,301 B2 3/2004 Tai et al.
(Continued)

FOREIGN PATENT DOCUMENTS

KR 0500924 B1 7/2005

*Primary Examiner* — Selim U Ahmed
*Assistant Examiner* — Evan G Clinton
(74) *Attorney, Agent, or Firm* — Volentine, Whitt & Francos, PLLC

(57) ABSTRACT

A semiconductor device and a method of forming the same, the semiconductor device including an insulating structure having an opening; a conductive pattern disposed in the opening; a barrier structure covering a bottom surface of the conductive pattern, the barrier structure extending between the conductive pattern and side walls of the opening; and a nucleation structure disposed between the conductive pattern and the barrier structure. The nucleation structure includes a first nucleation layer that contacts the barrier structure, and a second nucleation layer that contacts the conductive pattern, and a top end portion of the second nucleation layer is higher than a top end portion of the first nucleation layer.

20 Claims, 23 Drawing Sheets

Related U.S. Application Data continuation of application No. 15/806,527, filed on Nov. 8, 2017, now Pat. No. 10,366,955.

(51) Int. Cl.

| | | |
|---|---|---|
| *H01L 29/06* | (2006.01) | |
| *H01L 23/535* | (2006.01) | |
| *H01L 29/417* | (2006.01) | |
| *B24B 37/04* | (2012.01) | |
| *H01L 21/768* | (2006.01) | |
| *H01L 21/321* | (2006.01) | |
| *H01L 21/285* | (2006.01) | |
| *C23C 16/455* | (2006.01) | |
| *H01L 23/485* | (2006.01) | |

(52) U.S. Cl.
CPC .. *H01L 21/28556* (2013.01); *H01L 21/28562* (2013.01); *H01L 21/3212* (2013.01); *H01L 21/7684* (2013.01); *H01L 21/76846* (2013.01); *H01L 21/76876* (2013.01); *H01L 21/76877* (2013.01); *H01L 23/485* (2013.01); *H01L 23/528* (2013.01); *H01L 23/535* (2013.01); *H01L 29/0649* (2013.01); *H01L 29/41791* (2013.01)

(58) Field of Classification Search
CPC . H01L 23/522–53295; H01L 21/3205–32155; H01L 21/823475; H01L 2221/10–1094
See application file for complete search history.

(56) References Cited

U.S. PATENT DOCUMENTS

| | | |
|---|---|---|
| 6,977,215 B2 | 12/2005 | Jacobs et al. |
| 7,052,992 B2 | 5/2006 | Jacobs et al. |
| 7,145,241 B2 | 12/2006 | Takayama et al. |
| 7,253,092 B2 | 8/2007 | Dauch et al. |
| 7,339,127 B2 | 3/2008 | Renner et al. |
| 7,830,016 B2 | 11/2010 | Meldrim et al. |
| 8,058,170 B2 | 11/2011 | Chandrashekar et al. |
| 9,040,421 B2 | 5/2015 | Zhang et al. |
| 2004/0152305 A1 | 8/2004 | Yiu et al. |
| 2004/0175926 A1 | 9/2004 | Wang et al. |
| 2008/0149591 A1 | 6/2008 | Siddiqui et al. |
| 2009/0142925 A1 | 6/2009 | Ha et al. |
| 2014/0213031 A1* | 7/2014 | Lin ................ H01L 29/66545 438/296 |
| 2016/0020142 A1* | 1/2016 | Chen ................ H01L 21/76862 438/654 |

* cited by examiner

SEMICONDUCTOR DEVICE INCLUDING CONDUCTIVE STRUCTURE HAVING NUCLEATION STRUCTURE AND METHOD OF FORMING THE SAME

CROSS-REFERENCE TO RELATED APPLICATION

This is a Continuation of U.S. application Ser. No. 16/441,433, filed Jun. 14, 2019, which is a Continuation of U.S. application Ser. No. 15/806,527, filed Nov. 8, 2017, in which a claim of priority is made to Korean Patent Application No. 10-2017-0011965, filed on Jan. 25, 2017 in the Korean Intellectual Property Office, the entire contents of which are hereby incorporated by reference.

BACKGROUND

The present inventive concept relates to a semiconductor device and a method of forming a semiconductor device and, more particularly, to a semiconductor device including a conductive structure having a nucleation structure and a method of forming a semiconductor device including the aforementioned conductive structure.

With the recent trend of increasing integration in semiconductor devices, the size of elements configuring semiconductor devices has been reduced. For example, the size of elements formed of a metallic material, such as contact plugs for example, has been reduced. However, as contact plugs have been reduced in size, small defects that may occur therein are increasingly affecting the performance or operating characteristics of semiconductor devices.

SUMMARY

Embodiments of the inventive concept provide a semiconductor device including a conductive structure which may reduce the occurrence of defects.

Embodiments of the inventive concept may provide a semiconductor device including a conductive structure that may improve electrical characteristics.

Embodiments of the inventive concept provide a semiconductor device including an insulating structure having an opening; a conductive pattern disposed in the opening; a barrier structure extending between the conductive pattern and side walls of the opening, the barrier structure covering a bottom surface of the conductive pattern; and a nucleation structure disposed between the conductive pattern and the barrier structure. The nucleation structure includes a first nucleation layer that contacts the barrier structure, and a second nucleation layer that contacts the conductive pattern, and a top end portion of the second nucleation layer is above a top end portion of the first nucleation layer.

Embodiments of the inventive concept provide a semiconductor device including a first insulating structure having an opening; and a first conductive structure disposed in the opening. The first conductive structure includes a barrier structure, a nucleation structure, and a conductive pattern. The barrier structure and the nucleation structure extend between the conductive pattern and the first insulating structure, the barrier structure covering a bottom surface of the conductive pattern. The nucleation structure is disposed between the barrier structure and the conductive pattern. The nucleation structure includes a first impurity element. The nucleation structure includes a first nucleation layer that contacts the barrier structure, and a second nucleation layer that contacts the conductive pattern. A concentration of the first impurity element in the first nucleation layer is higher than a concentration of the first impurity element in the second nucleation layer.

Embodiments of the present inventive concept provide a method of forming a semiconductor device including forming a barrier material layer; forming a nucleation material layer on the barrier material layer; and forming a conductive material layer on the nucleation material layer. The nucleation material layer is formed by performing a deposition process using a first reducing material, a second reducing material, and a source material. A Gibbs free energy of the first reducing material with respect to the source material is lower than a Gibbs free energy of the second reducing material with respect to the source material. The forming of the nucleation material layer includes an initial unit process of forming a first nucleation material that contacts the barrier material layer, and a final unit process of forming a second nucleation material that contacts the conductive material layer. The initial unit process includes supplying the first reducing material and the source material to a process chamber sequentially. The final unit process includes supplying the second reducing material and the source material to the process chamber sequentially.

Embodiments of the inventive concept provide a method of forming a semiconductor device including forming a barrier material layer; forming a nucleation material layer on the barrier material layer; and forming a conductive material layer on the nucleation material layer. The nucleation material layer is formed by performing a first deposition process using a first reducing material, a second reducing material, and a source material. The forming of the nucleation material layer includes an initial unit process of forming a first nucleation material that is amorphous and that contacts the barrier material layer, and a final unit process of forming a second nucleation material that is crystalline and that contacts the conductive material layer. The initial unit process includes supplying the first reducing material and the source material to a process chamber sequentially. The final unit process includes supplying the second reducing material and the source material to the process chamber sequentially.

Embodiments of the inventive concept further provide a semiconductor device including a device isolation region disposed on a substrate, the device isolation region defining active regions; a gate disposed over the active regions; gate insulating spacers covering side walls of the gate; and source/drain regions disposed on both sides of the gate over the active regions. The gate includes a first conductive layer, a second conductive layer and a third conductive layer. The third conductive layer is disposed between the gate insulating spacers. The first conductive layer covers lateral surfaces and a bottom surface of the third conductive layer. The second conductive layer is disposed between the first conductive layer and the third conductive layer. The second conductive layer comprises a first nucleation layer contacting the first conductive layer and a second nucleation layer contacting the third conductive layer. A top end portion of the second nucleation layer is above a top end portion of the first nucleation layer.

Embodiments of the inventive concept further provide a semiconductor device including an device isolation region defining active region; a source/drain region on the active region; and a contact plug on the source/drain region. The contact plug includes a barrier structure, a nucleation structure and a conductive pattern. The barrier structure covers lateral surfaces and a bottom surface of the conductive pattern. The nucleation structure is disposed between the conductive pattern and the barrier structure. The nucleation structure comprises a first nucleation layer disposed between the conductive pattern and the barrier structure, and a second nucleation layer disposed between the first nucleation layer and the conductive pattern. A top end portion of the second nucleation layer is above a top end portion of the first nucleation layer.

BRIEF DESCRIPTION OF DRAWINGS

The above, and other aspects, features, and advantages of the inventive concept will be more clearly understood from the following detailed description when taken in conjunction with the accompanying drawings, in which.

DETAILED DESCRIPTION

Figure 1:
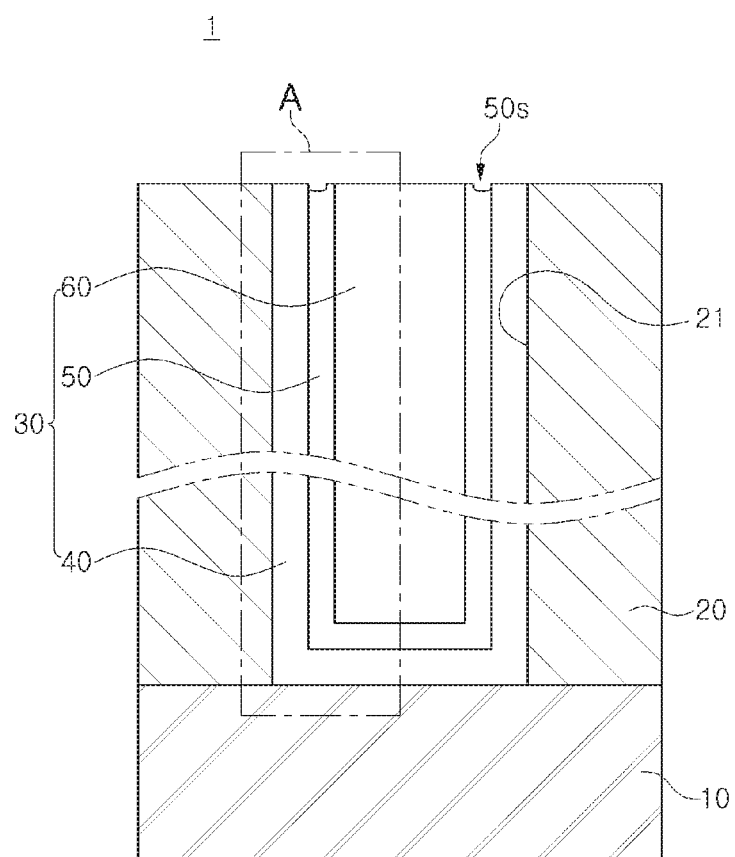
FIG. 1 illustrates a cross-sectional view of a semiconductor device according to an example embodiment of the inventive concept.

A semiconductor device 1 according to an example embodiment of the inventive concept will be described with reference to FIG. 1. FIG. 1 illustrates a cross-sectional view of the semiconductor device 1 according to an example embodiment of the inventive concept.

Referring to FIG. 1, the semiconductor device 1 according to an example embodiment includes a substrate 10, an insulating structure 20, and a conductive structure 30.

The insulating structure 20 has an opening 21. The opening 21 of the insulating structure 20 may pass through the insulating structure 20. In an example embodiment, the opening 21 of the insulating structure 20 may expose a portion of the substrate 10. The insulating structure 20 may be formed of an insulating material such as for example a low-k dielectric, a silicon oxide, or a silicon nitride, or the like. The insulating structure 20 may include a single layer, but the inventive concept is not limited thereto. For example, in other embodiments of the inventive concept the insulating structure 20 may include two or more insulating material layers.

The substrate 10 may include a variety of components thereon. For example, the substrate 10 may include a source/drain region of a transistor. Thus, the portion of the substrate 10 exposed by the opening 21 of the insulating structure 20 may be the source/drain region. However, the inventive concept is not limited thereto. For example, the substrate 10 may include a well contact region for contact of a well region in the substrate 10, and the portion of the substrate 10 exposed by the opening 21 of the insulating structure 20 may be the well contact region. Alternatively, the portion of the substrate 10 exposed by the opening 21 of the insulating structure 20 may be a conductive contact pad region for electrically connecting a channel region of a transistor or wirings.

The conductive structure 30 is disposed in the opening 21 of the insulating structure 20. In an example embodiment, the conductive structure 30 may fill the opening 21.

The conductive structure 30 includes a barrier structure 40, a nucleation structure 50, and a conductive pattern 60.

The conductive pattern 60 may have a pillar shape. The barrier structure 40 and the nucleation structure 50 extend between the conductive pattern 60 and the insulating structure 20 while covering a bottom surface of the conductive pattern 60. The barrier structure 40 extends between the conductive pattern 60 and side walls of the opening 21. More particularly, the barrier structure 40 extends between the nucleation structure 50 and side walls of the opening 21. That is, the nucleation structure 50 is disposed between the barrier structure 40 and the conductive pattern 60. The conductive pattern 60 may include for example a bulk tungsten (W) material, formed using the nucleation structure 50 as a seed.

A portion of a top surface of the conductive structure 30 may be recessed. The barrier structure 40 and the conductive pattern 60 may have coplanar top surfaces. At least a portion of a top surface 50s of the nucleation structure 50 may be recessed. The at least a portion of the top surface 50s of the nucleation structure 50 may be a stepped top surface.

Figure 2:
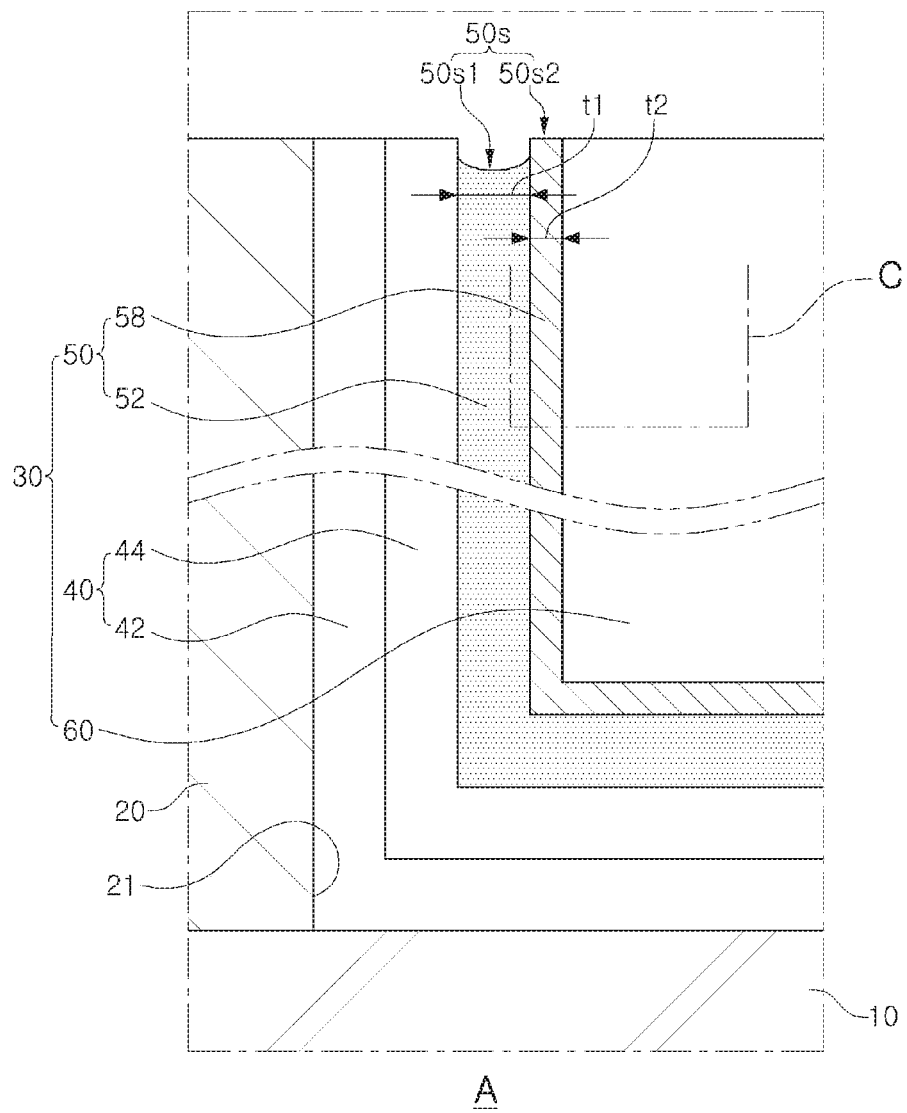
FIG. 2 illustrates an enlarged view of part A of FIG. 1.

An example of the barrier structure 40 and the nucleation structure 50 will be described with reference to FIG. 2. FIG. 2 illustrates an enlarged view of part A of FIG. 1.

Referring to FIGS. 1 and 2, the barrier structure 40 includes a first barrier layer 42 and a second barrier layer 44. The first barrier layer 42 may contact the insulating structure 20. In an example embodiment, the first barrier layer 42 contacts the substrate 10. The second barrier layer 44 is interposed between the nucleation structure 50 and the first barrier layer 42 and may contact the nucleation structure 50.

The first barrier layer 42 may be formed of a metallic material, and the second barrier layer 44 may be formed of a nitride of the metallic material forming the first barrier layer 42. For example, the first barrier layer 42 may be formed of titanium (Ti), and the second barrier layer 44 may be formed of titanium nitride (TiN).

The nucleation structure 50 includes a first nucleation layer 52 and a second nucleation layer 58. The first nucleation layer 52 may contact the barrier structure 40, and the second nucleation layer 58 may contact the conductive pattern 60.

In an example embodiment, the thickness t1 of the first nucleation layer 52 is greater than the thickness t2 of the second nucleation layer 58.

A top end portion 50s1 of the first nucleation layer 52 may be recessed further than a top end portion 50s2 of the second nucleation layer 58. The top end portion 50s1 of the first nucleation layer 52 may be lower than the top end portion 50s2 of the second nucleation layer 58, and thus a height difference between the top end portion 50s1 of the first nucleation layer 52 and the top end portion 50s2 of the second nucleation layer 58 may cause a step to be formed on the top surface 50s of the nucleation structure 50. In other words, the top end portion 50s2 of the second nucleation layer 58 is higher than (or above) the top end portion 50s1 of the first nucleation layer 52. In an example embodiment, the second nucleation layer 58 may protect the conductive pattern 60 while covering a lateral surface of the conductive pattern 60.

Figure 3:
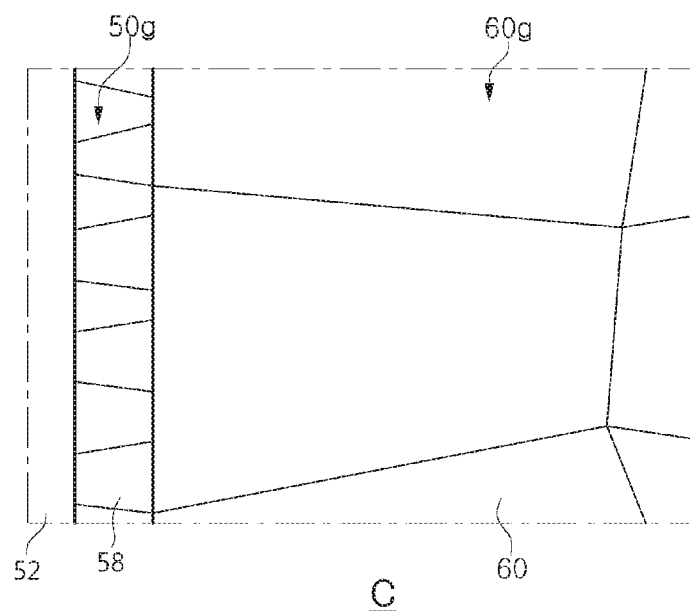
FIG. 3 illustrates an enlarged view of part C of FIG. 2.

An example of a crystal structure of the nucleation structure 50 and the conductive pattern 60 will be described with reference to FIG. 3. FIG. 3 illustrates an enlarged view of part C of FIG. 2.

Referring to FIG. 3, the second nucleation layer 58 and the conductive pattern 60 may have the crystal structure. That is, second nucleation layer 58 and the conductive pattern 60 may be crystalline. The size of grains 50g of the second nucleation layer 52 may be smaller than of grains 60g of the conductive pattern 60. In an example embodiment, the first nucleation layer 52 may have an amorphous structure.

In an example embodiment, the nucleation structure 50 may be formed of a nucleation material, including impurity elements. The nucleation structure 50 that may be formed of the nucleation material, including the impurity elements, will be described with reference to FIGS. 1, 2, and 4.

Figure 4:
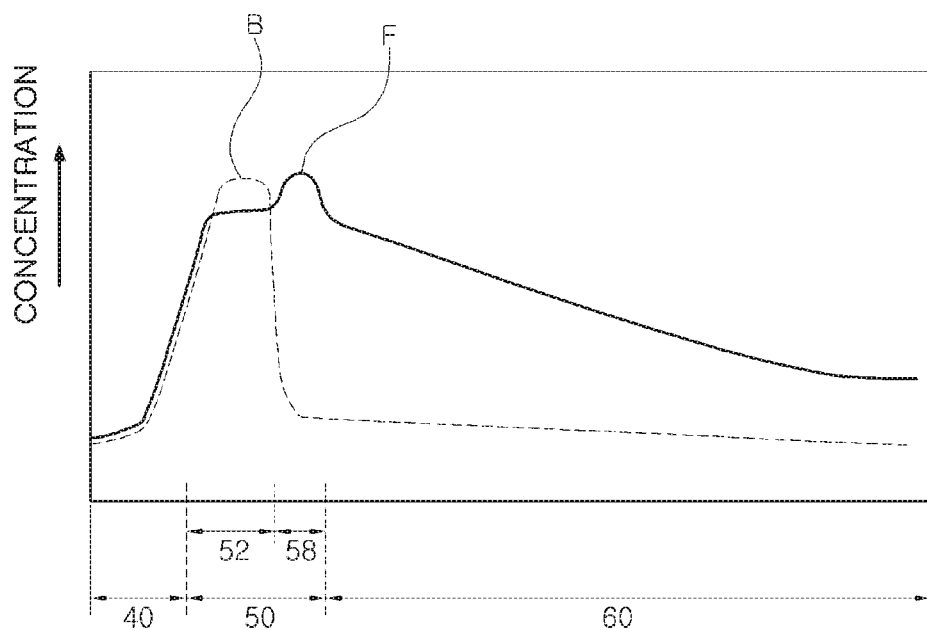
FIG. 4 illustrates a graph schematically showing distribution characteristics of impurity elements in some components of a semiconductor device according to an example embodiment of the inventive concept.

FIG. 4 illustrates a graph schematically showing distribution characteristics of impurity elements in some components of the semiconductor device 1 according to an example embodiment of the inventive concept.

Referring to FIGS. 1, 2, and 4, the nucleation structure 50 may be formed of the nucleation material including the impurity elements. In an example embodiment, the nucleation material of the nucleation structure 50 may be a tungsten (W) nucleation material. In the nucleation structure 50, the first nucleation layer 52 may be formed of a first nucleation material, and the second nucleation layer 58 may be formed of a second nucleation material. The first and second nucleation materials may be tungsten (W) nucleation materials.

The first nucleation material of the first nucleation layer 52 may be formed using an atomic layer deposition (ALD) process, using a first reducing material and a source material. The second nucleation material of the second nucleation layer 58 may be formed using an ALD process, using a second reducing material different from the second reducing material and the source material. The first reducing material may have Gibbs free energy with respect to the source material that is lower than that of a Gibbs free energy of the second reducing material with respect to the source material. For example, in an embodiment of the inventive concept the first reducing material may be $B_2H_4$ gas, the second reducing material may be $SiH_4$ gas or $GeH_4$ gas, and the source material may be $WF_6$ gas.

As described above, the first nucleation layer 52 formed of the first nucleation material may contact the barrier structure 40, and the second nucleation layer 58 formed of the second nucleation material may be spaced apart from the barrier structure 40, thereby significantly reducing or preventing a volcano defect that may occur due to volatile titanium fluoride ($TiF_3$). The volatile $TiF_3$ is formed by a reaction between $F^-$ of the $WF_6$ gas used to form the nucleation structure 50, and titanium (Ti) of the barrier structure 40 formed of a titanium (Ti)/titanium nitride (TiN) material. As understood in view of FIG. 3, the grains 60g of the conductive pattern 60 have a grain size greater than a grain size of the grains 50g of the second nucleation material of the second nucleation layer 58.

In an example embodiment, there may remain a portion of elements, that is a portion of the forming gases, used to form the first and second nucleation layers 52 and 58 of the nucleation structure 50 using the first and second nucleation materials. For example, boron (B) of the $B_2H_4$ gas and fluorine (F) of the $WF_6$ gas in the nucleation structure 50 may remain.

In this specification, boron (B) remaining in the nucleation structure 50 is referred to as a "first impurity element," and fluorine (F) remaining in the nucleation structure 50 is referred to as a "second impurity element."

The conductive pattern 60 may include a bulk metal material, formed using the nucleation structure 50 as a seed. The bulk metal material included in the conductive pattern 60 may be formed using a chemical vapor deposition (CVD) process, using a third reducing material different from the first and second reducing materials and the source material. The third reducing material may be $H_2$ gas, and the source material may be $WF_6$ gas.

FIG. 4 is a graph schematically illustrating distribution characteristics of the first and second impurity elements B and F remaining in the nucleation structure 50 and the conductive pattern 60, when the first nucleation layer 52 is formed using an ALD process using $B_2H_4$ gas as the first reducing material and $WF_6$ gas as the source material, the second nucleation layer 58 is formed using an ALD process using $SiH_4$ gas as the second reducing material and $WF_6$ gas as the source material, and the conductive pattern 60 is formed using a CVD process using $H_2$ gas as the third reducing material and $WF_6$ gas as the source material. In the graph of FIG. 4, the dotted line indicates the distribution characteristics of the first impurity element B, and the solid line indicates the distribution characteristics of the second impurity element F.

In the nucleation structure 50, the concentration of the first impurity element B in the first nucleation layer 52 may be higher than the concentration of the first impurity element B in the second nucleation layer 58. In addition, in the nucleation structure 50, the concentration of the second impurity element F in the second nucleation layer 58 may be higher than the concentration of the second impurity element F in the first nucleation layer 52. Thus, the first nucleation material of the first nucleation layer 52 may have the first impurity element B in a higher concentration than that of the first impurity element B in the second nucleation material of the second nucleation layer 58, and may have the second impurity element F in a lower concentration than that of the second impurity element F in the second nucleation material of the second nucleation layer 58. A portion of the nucleation structure 50 adjacent to the barrier structure 40 may have the first impurity element B in a higher concentration than that in a portion of the nucleation structure 50 adjacent to the conductive pattern 60, and may have the second impurity element F in a lower concentration than that in the portion of the nucleation structure 50 adjacent to the conductive pattern 60.

The concentrations of the first and second impurity elements B and F in the nucleation structure 50 may be higher than those in the conductive pattern 60.

In an example embodiment, the first nucleation material of the first nucleation layer 52 may be less influenced by a material type or characteristic of the barrier structure 40 than the second nucleation material of the second nucleation layer 58. Thus, the first nucleation layer 52 may be deposited or formed on the barrier structure 40 to have a thickness that is more uniform than that of the second nucleation layer 58. That is, although the second nucleation material is not deposited on the barrier structure 40 and does not have a thickness that is more uniform than that of the first nucleation material, the second nucleation material is deposited on the first nucleation material to have a uniform thickness. Thus, the second nucleation layer 58 may be deposited or formed on the first nucleation layer 52 to have a uniform thickness. As a result, the nucleation structure 50 may be formed on the barrier structure 40 to have a uniform thickness. As described with reference to FIG. 3, the first nucleation material of the first nucleation layer 52 may have an amorphous structure, and the second nucleation material of the second nucleation layer 58 may have a crystal structure.

As described above, the first and second nucleation layers 52 and 58 may be formed of first and second nucleation materials having different crystal structures and different deposition characteristics, and thus the occurrence of defects in the conductive structure 30 may be suppressed. In addition, the first and second nucleation layers 52 and 58 may increase electrical characteristics of the conductive structure 30.

As described above, the nucleation structure 50 may include two layers such as the first and second nucleation layers 52 and 58, but the inventive concept is not limited thereto. For example, in other embodiments of the inventive concept the nucleation structure 50 may include one or more intermediate nucleation layers interposed between the first nucleation layer 52 contacting the barrier structure 40, and the second nucleation layer 58 contacting the conductive pattern 60. Examples of the nucleation structure 50 including the one or more intermediate nucleation layers will be described with reference to FIGS. 5A through 5D. FIGS. 5A to 5D are enlarged views of part A of FIG. 1, respectively.

Figure 5A:
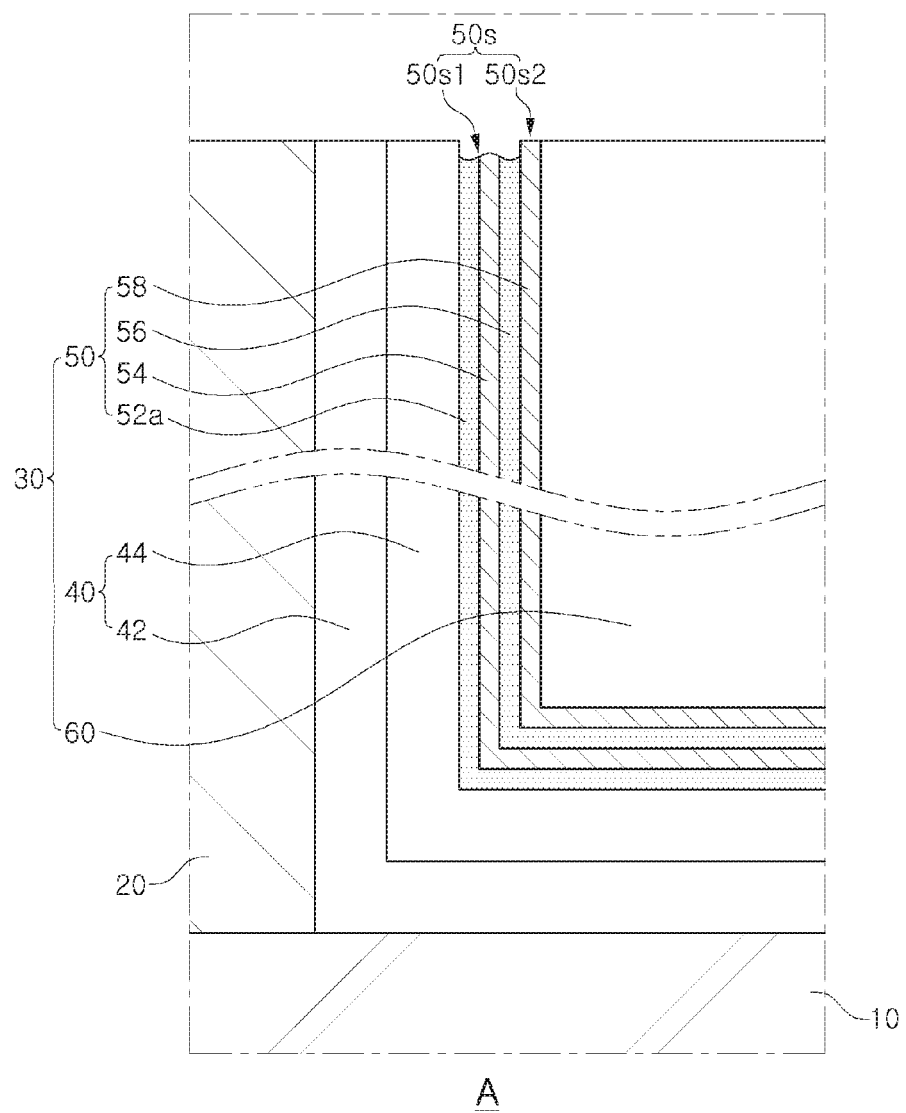
FIG. 5A illustrates a cross-sectional view of a modified example of a semiconductor device according to an example embodiment of the inventive concept.

FIG. 5A illustrates a cross-sectional view of a modified example of semiconductor device 1 according to an example embodiment of the inventive concept. Referring first to FIG. 5A, a nucleation structure 50 includes a first nucleation layer 52a contacting the barrier structure 40, a second nucleation layer 58 contacting the conductive pattern 60, and intermediate nucleation layers 54 and 56 disposed between the first and second nucleation layers 52a and 58.

In this specification, the first nucleation layer 52a is referred to as an "initial nucleation layer", and the second nucleation layer 58 is referred to as a "final nucleation layer".

The intermediate nucleation layers 54 and 56 may include a first intermediate nucleation layer 54 contacting the first nucleation layer 52a, and a second intermediate nucleation layer 56 contacting the second nucleation layer 58. In other words, the first intermediate nucleation layer 54 is disposed between the first nucleation layer 52a and the second nucleation layer 58, and the second intermediate nucleation layer 56 is disposed between the first intermediate nucleation layer 54 and the second nucleation layer 58.

In an example embodiment, the first intermediate nucleation layer 54 may be formed using an ALD process using the same reducing material and source material as those in the second nucleation layer 58, and the second intermediate nucleation layer 56 may be formed using an ALD process using the same reducing material and source material as those in the first nucleation layer 52a. Thus, the first intermediate nucleation layer 54 and the second nucleation layer 58 may include (be formed of) a nucleation material having substantially the same crystal structure and composition (e.g., second nucleation material), and the second intermediate nucleation layer 56 and the first nucleation layer 52a may include (be formed of) a nucleation material having substantially the same crystal structure and composition (e.g., first nucleation material). Thus, the second intermediate nucleation layer 56 and the first nucleation layer 52a may be formed of the first nucleation material as described with reference to FIGS. 1 through 4, and the first intermediate nucleation layer 54 and the second nucleation layer 58 may be formed of the second nucleation material as described with reference to FIGS. 1 through 4. The first and second nucleation materials have been described above with reference to FIGS. 1 through 4, and thus detailed descriptions thereof will be omitted.

In example embodiments similar as shown in FIG. 5A, the first nucleation layer 52a and the second intermediate nucleation layer 56 may have substantially the same thickness. However, the inventive concept is not limited thereto, and a thickness of the first nucleation layer 52*a* may be different than a thickness of the second intermediate nucleation layer 56.

Figure 5B:
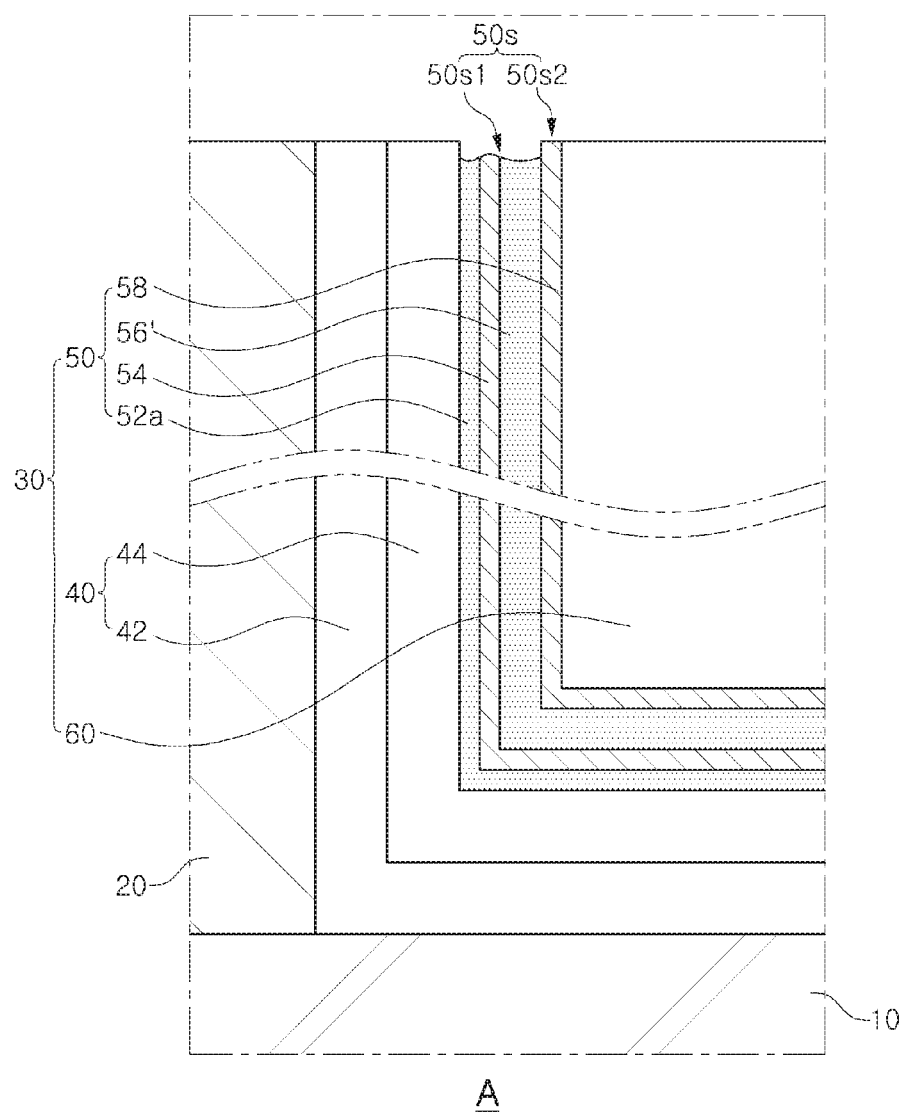
FIG. 5B illustrates a cross-sectional view of another modified example of a semiconductor device according to an example embodiment of the inventive concept.

For example, FIG. 5B illustrates a cross-sectional view of another modified example of semiconductor device 1 according to an example embodiment of the inventive concept. As illustrated in FIG. 5B, a nucleation structure 50 includes the first nucleation layer 52*a*, the first intermediate nucleation layer 54, a second intermediate nucleation layer 56' having an increased thickness compared to the thickness of the first nucleation layer 52*a*, and the second nucleation layer 58. Thus, in FIG. 5B, a thickness of the second intermediate nucleation layer 56' is greater than a thickness of the first nucleation layer 52*a*.

In example embodiments similar as shown in FIG. 5A, the second nucleation layer 58 and the first intermediate nucleation layer 54 may have substantially the same thickness. However, the present inventive concept is not limited thereto, and a thickness of the second nucleation layer 58 may be different than a thickness of the first intermediate nucleation layer 54.

Figure 5C:
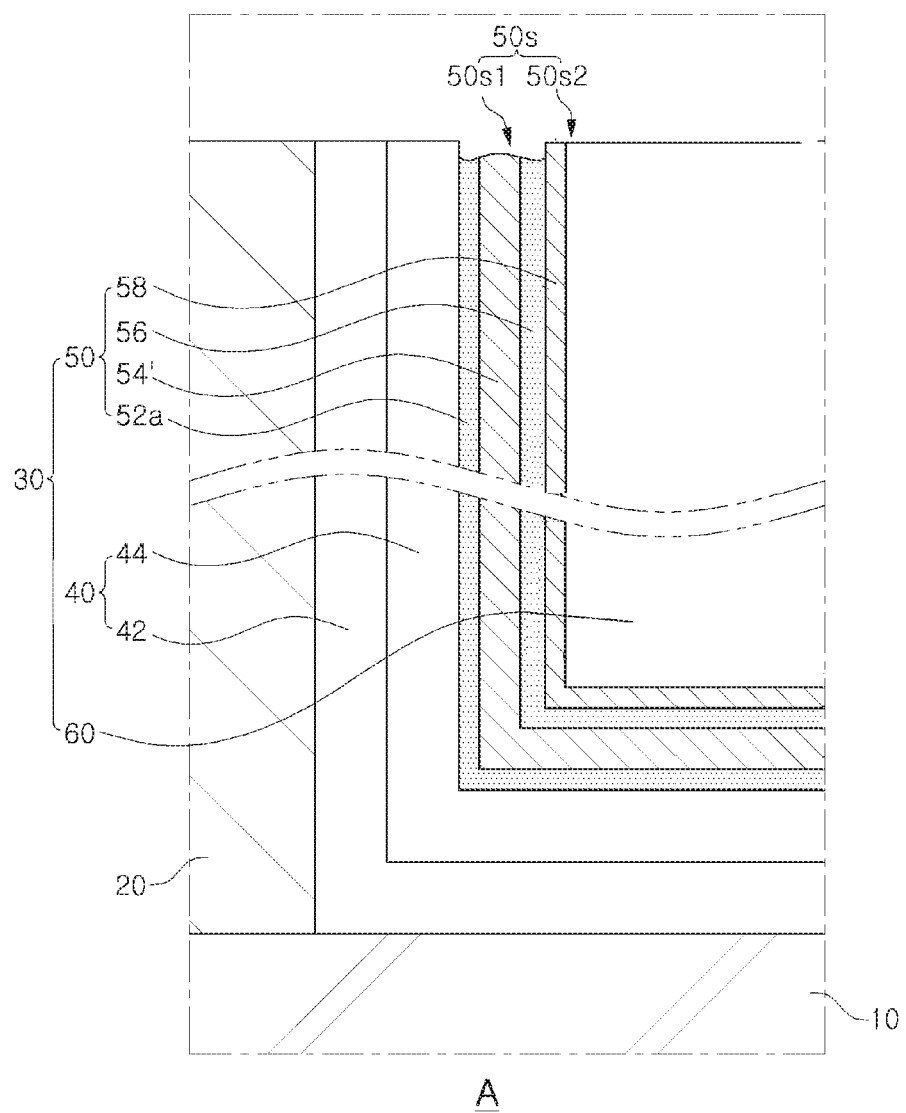
FIG. 5C illustrates a cross-sectional view of another modified example of a semiconductor device according to an example embodiment of the inventive concept.

For example, FIG. 5C illustrates a cross-sectional view of another modified example of semiconductor device 1 according to an example embodiment of the inventive concept. As illustrated in FIG. 5C, a nucleation structure 50 includes the first nucleation layer 52*a*, a first intermediate nucleation layer 54' having an increased thickness compared to the thickness of the second nucleation layer 58, the second intermediate nucleation layer 56, and the second nucleation layer 58. Thus, in FIG. 5C, a thickness of the first intermediate nucleation layer 54' is greater than a thickness of the second nucleation layer 58.

In example embodiments similar as shown in FIG. 5A, the first nucleation layer 52*a* and the second intermediate nucleation layer 56 may have substantially the same thickness, and the second nucleation layer 58 and the first intermediate nucleation layer 54 may have substantially the same thickness. However, the present inventive concept is not limited thereto, and a thickness of the first nucleation layer 52*a* may be different than a thickness of the second intermediate nucleation layer 56, and a thickness of the second nucleation layer 58 may be different than a thickness of the first intermediate nucleation layer 54.

Figure 5D:
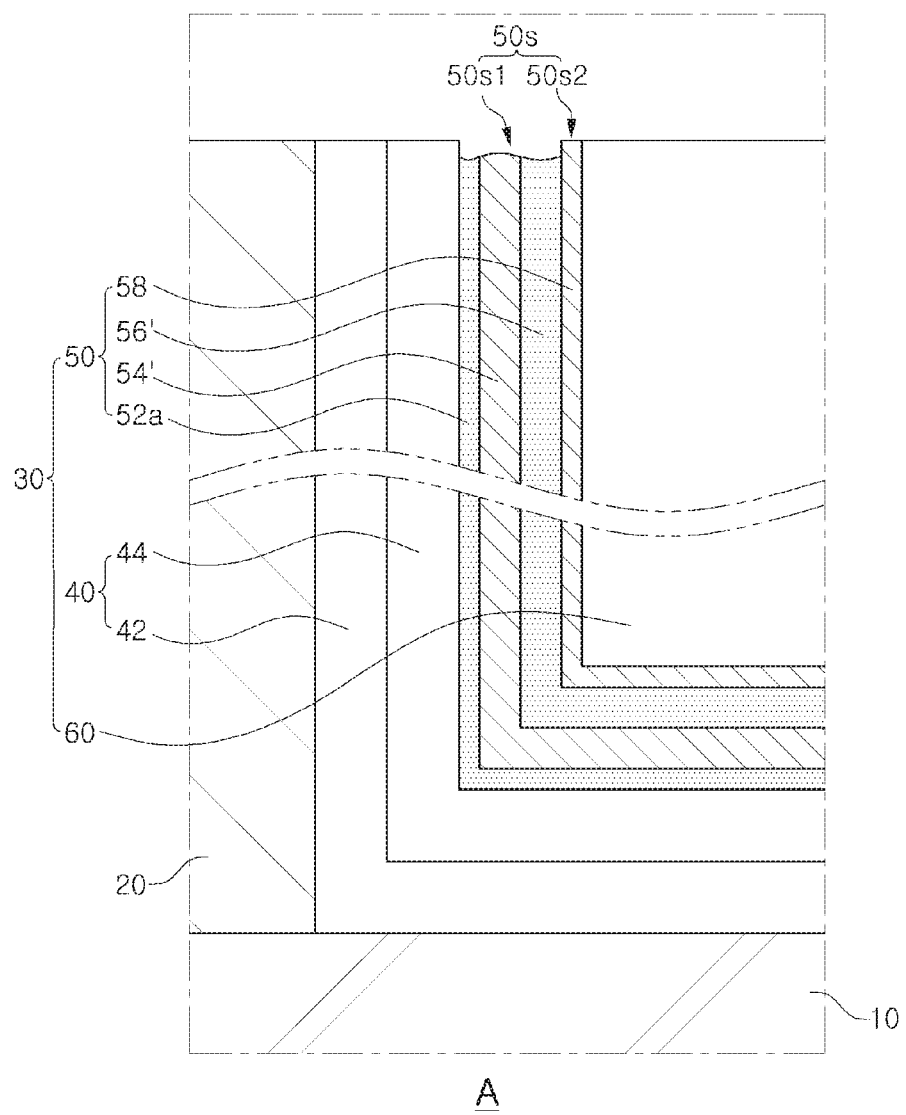
FIG. 5D illustrates a cross-sectional view of another modified example of a semiconductor device according to an example embodiment of the inventive concept.

For example, FIG. 5D illustrates a cross-sectional view of another modified example of semiconductor device 1 according to an example embodiment of the inventive concept. As illustrated in FIG. 5D, a nucleation structure 50 includes the first nucleation layer 52*a*, a first intermediate nucleation layer 54' having an increased thickness as compared with the second nucleation layer 58, a second intermediate nucleation layer 56' having an increased thickness as compared to the first nucleation layer 52*a*, and the second nucleation layer 58. In FIG. 5D, a thickness of the first intermediate nucleation layer 54' is greater than a thickness of the second nucleation layer 58, and a thickness of the second intermediate nucleation layer 56' is greater than a thickness of the first nucleation layer 52*a*.

In embodiments of the inventive concept, a thickness of the first intermediate nucleation layer 54 (54') may be different than a thickness of the second intermediate nucleation layer 56 (56'). In embodiments of the inventive concept, at least one of the first intermediate nucleation layer 54' and the second intermediate nucleation layer 56' is thicker than at least one of the first nucleation layer 52*a* and the second nucleation layer 58.

The conductive structure 30 described above with reference to FIGS. 1 through 5D may be a contact plug of a semiconductor device. However, the inventive concept is not limited thereto. For example, in some embodiments of the inventive concept the conductive structure 30 may also be a wiring or a gate electrode having a line shape. The conductive structure 30 as described above may be used in a contact plug, a gate electrode, or a wiring. An example of the conductive structure 30, as applied to a contact plug or a gate electrode, will hereinafter be described with reference to FIG. 6.

Figure 6:
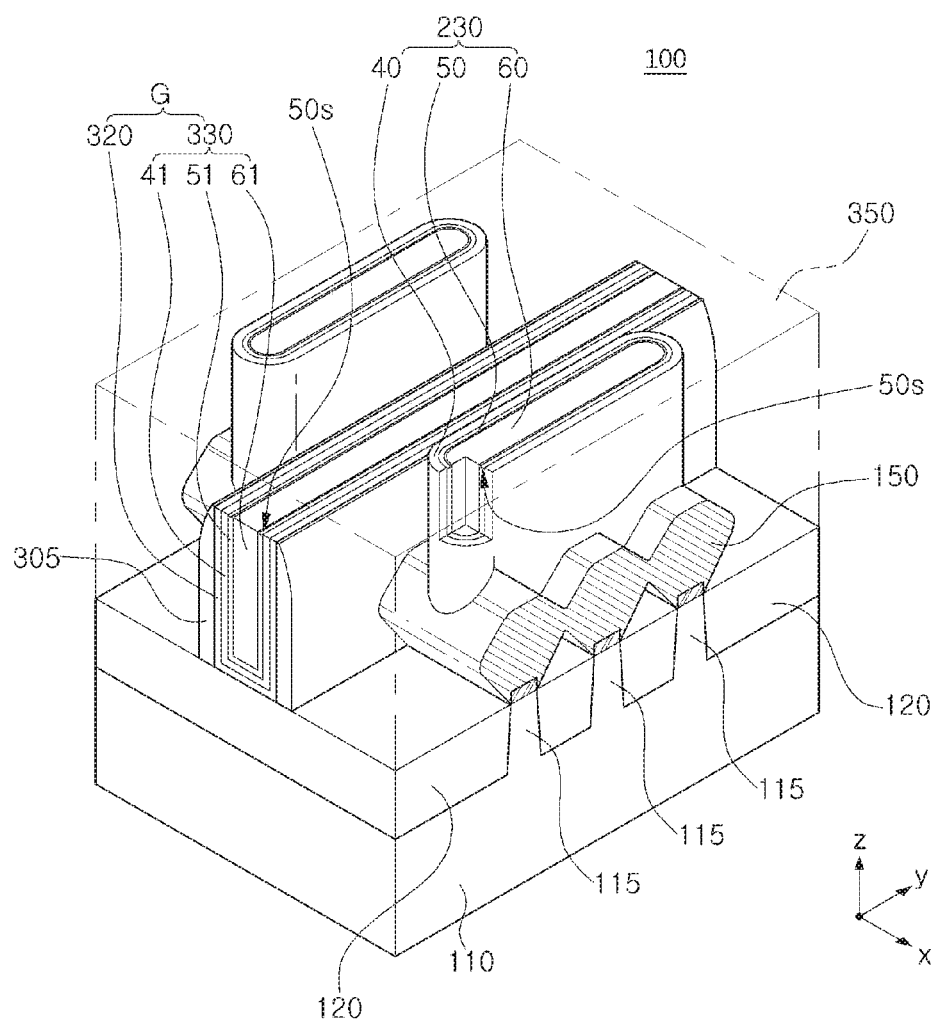
FIG. 6 illustrates a perspective view of a semiconductor device according to an example embodiment of the inventive concept.

FIG. 6 illustrates a perspective view of a semiconductor device 100 according to an example embodiment of the inventive concept.

Referring to FIG. 6, the semiconductor device 100 includes a device isolation region 120 disposed on a semiconductor substrate 110 to define fin active regions 115, a gate G disposed over and traversing across the fin active regions 115, source/drain regions 150 disposed on the fin active regions 115 on both sides of the gate G, contact plugs 230 disposed on the source/drain regions 150, and an insulating structure 350 disposed on the semiconductor substrate 110. The insulating structure 350 may cover the source/drain regions 150 and the gate G. The contact plugs 230 may contact the source/drain regions 150 while passing through the insulating structure 350, and may be electrically connected to the source/drain regions 150.

The gate G and the source/drain regions 150 may configure a transistor. The gate G may include a gate dielectric 320 and a gate electrode 330. The gate dielectric 320 may cover lateral surfaces and a bottom surface of the gate electrode 330. The gate dielectric layer 320 may be formed of a silicon oxide or a high-k dielectric. Gate insulating spacers 305 may be disposed on (or covering) lateral surfaces (or side walls) of the gate G. The gate G is disposed in the opening between the gate insulating spacers 305.

In an example embodiment, the cross-sectional structure of the gate electrode 330 in a width direction (an x-axis direction) may be the same as that of one of the examples of the conductive structure 30 described with reference to FIGS. 1 through 5D. For example, the gate electrode 330 may include a first conductive layer 41 corresponding to the barrier structure 40, a second conductive layer 51 corresponding to the nucleation structure 50, and a third conductive layer 61 corresponding to the conductive pattern 60.

The cross-sectional structure of each of the contact plugs 230 may be the same as that of one of the examples of the conductive structure 30, described with reference to FIGS. 1 through 5D. Thus, the contact plug 230 may include the barrier structure 40, the nucleation structure 50, and the conductive pattern 60, described with reference to FIGS. 1 through 5D.

As a result, the structure of the conductive structure 30 including the barrier structure 40, the nucleation structure 50, and the conductive pattern 60 as described with reference to FIGS. 1 through 5D, may be applied to a contact plug or a gate electrode. For example, in an embodiment of the inventive concept, the gate G may include the conductive pattern 60 disposed between the gate insulating spacers 305; the barrier structure 40 extending between the conductive pattern 60 and the gate insulating spacers 305 with the barrier structure 40 covering a bottom surface of the conductive pattern; and the nucleation structure 50 disposed between the conductive pattern 60 and the barrier structure 40. Similarly as described previously and as may be appreciated in view of FIG. 2, the nucleation structure 50 may include a first nucleation layer 52 contacting the barrier structure 40 and a second nucleation layer 58 contacting the conductive pattern 60, and the top end portion 50*s*2 of the second nucleation layer 58 may be above the top end portion 50s1 of the first nucleation layer 52.

The conductive structure 30, described above with reference to FIGS. 1 through 5D, may be coupled or connected to other components of a semiconductor device to configure the semiconductor device. Examples of the semiconductor device, including the conductive structure 30 coupled or connected to other components of the semiconductor device as described above, will be described with reference to FIGS. 7A, 7B, 7C, 8A, 8B and 8C.

Figure 7A:
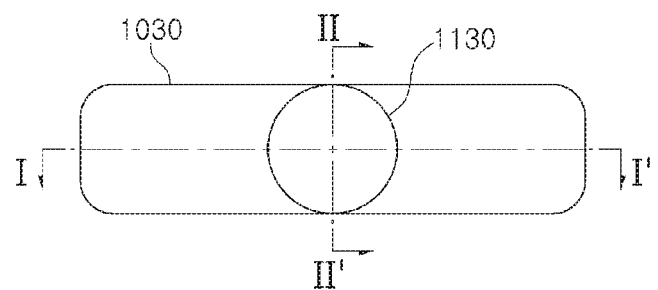
FIG. 7A illustrates a plan view of another modified example of a semiconductor device according to an example embodiment of the inventive concept.
Figure 7B:
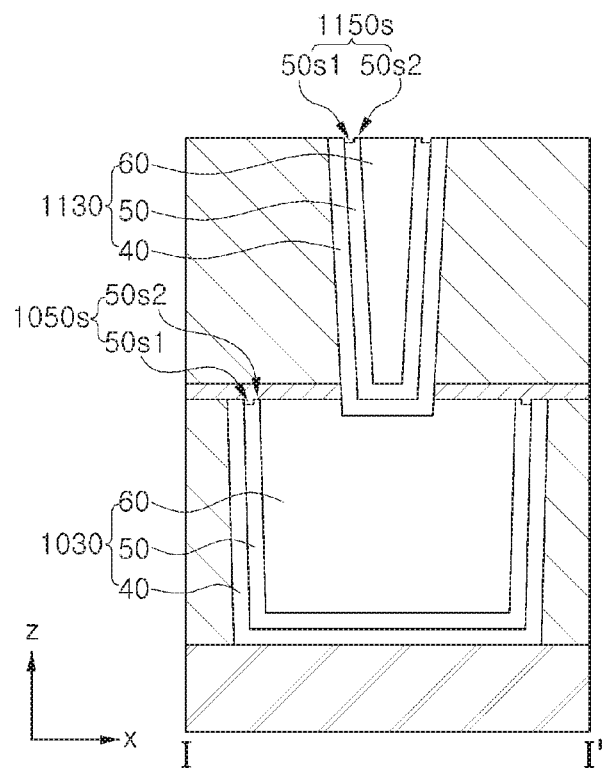
FIG. 7B illustrates a cross-sectional view of a region taken along lines I-I' and II-II' of FIG. 7A.
Figure 7C:
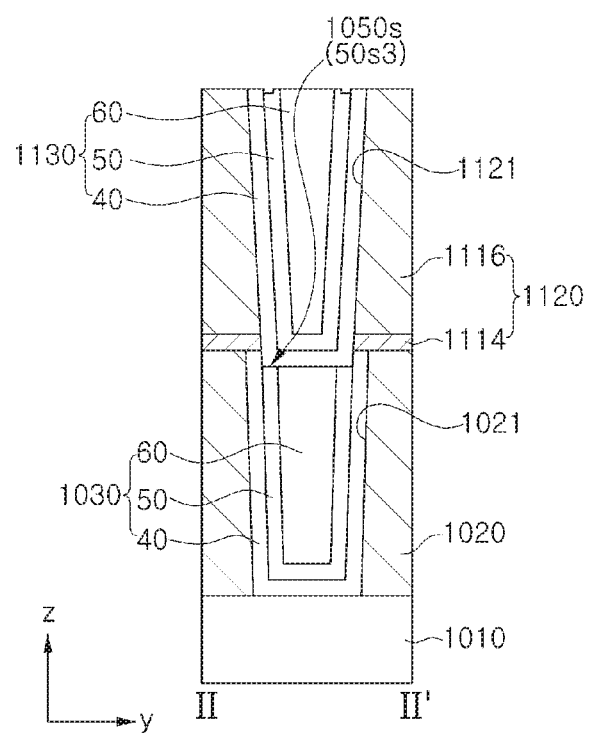
FIG. 7C illustrates a cross-sectional view of a region taken along lines II-II' of FIG. 7A.
Figure 8A:
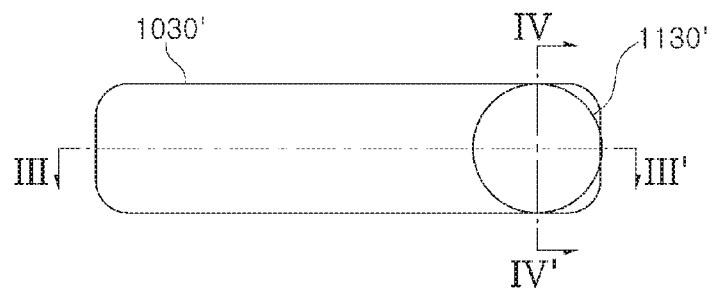
FIG. 8A illustrates a plan view of another modified example of a semiconductor device according to an example embodiment of the inventive concept.
Figure 8B:
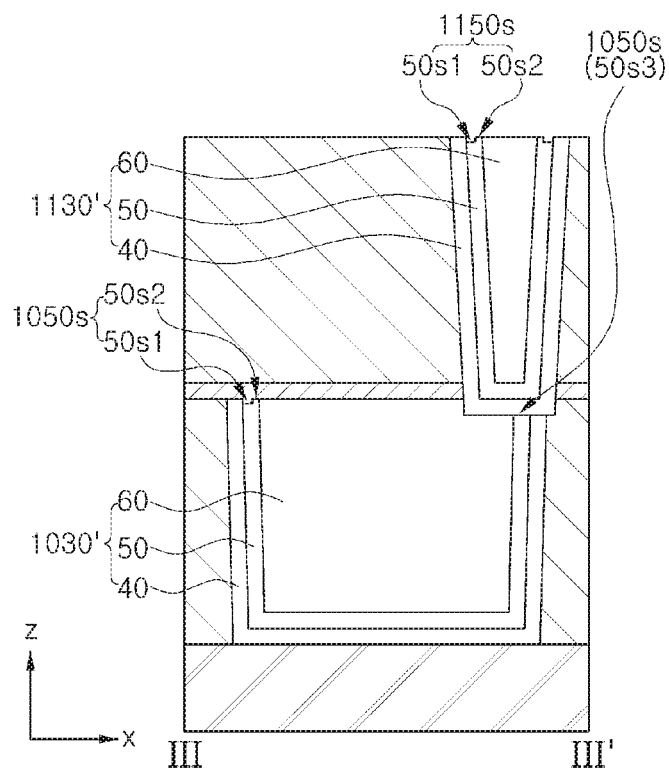
FIG. 8B illustrates a cross-sectional view of a region taken along lines III-III' of FIG. 8A.
Figure 8C:
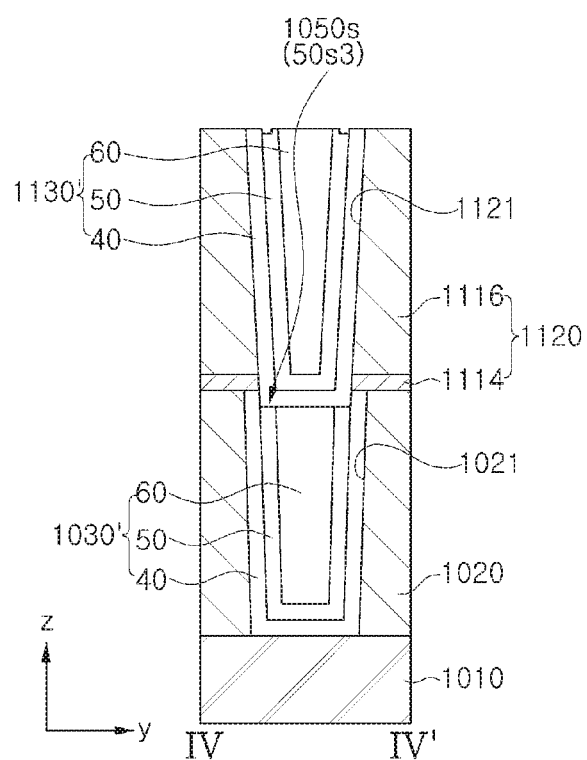
FIG. 8C illustrates a cross-sectional view of a region taken along lines IV-IV' of FIG. 8A.

FIG. 7A illustrates a plan view of another modified example of a semiconductor device according to an example embodiment of the inventive concept. FIG. 7B illustrates a cross-sectional view of a region taken along lines I-I' of FIG. 7A. FIG. 7C illustrates a cross-sectional view of a region taken along lines II-II' of FIG. 7A. FIG. 8A illustrates a plan view of another modified example of a semiconductor device according to an example embodiment of the inventive concept. FIG. 8B illustrates a cross-sectional view of a region taken along lines III-III' of FIG. 8A. FIG. 8C illustrates a cross-sectional view of a region taken along lines IV-IV' of FIG. 8A.

Referring to FIGS. 7A, 7B and 7C, a first insulating structure 1020 and a first conductive structure 1030 passing through the first insulating structure 1020 are disposed on or over a substrate 1010. The substrate 1010 may correspond to the substrate 10 described with reference to FIG. 1. A second insulating structure 1120 and a second conductive structure 1130 passing through the second insulating structure 1120 may be disposed on or over the first insulating structure 1020 and the first conductive structure 1030.

The first conductive structure 1030 is disposed in an opening (first opening) 1021 passing through the first insulating structure 1020. The second conductive structure 1130 is disposed in an opening (second opening) 1121 passing through the second insulating structure 1120. At least one of the first or second conductive structures 1030 or 1130 may be formed as one of the conductive structures 30 described with reference to FIGS. 1 through 5D. For example, the at least one of the first or second conductive structure 1030 or 1130 may be formed as the barrier structure 40, the nucleation structure 50, and the conductive pattern 60 described with reference to FIG. 1. Thus, at least a portion of a top surface 1050s of the nucleation structure 50 of the first conductive structure 1030, or at least a portion of a top surface 1150s of the nucleation structure 50 of the second conductive structure 1130, may be top end portions 50s1 and 50s2 having different heights, as described with reference to FIG. 2. The nucleation structure 50 and the top end portions 50s1 and 50s2 thereof as mentioned above have been described with reference to FIGS. 1 through 5D, and details thereof will be hereafter omitted.

The second insulating structure 1120 may include a first insulating layer 1114 and a second insulating layer 1116 disposed on (or over) the first insulating layer 1114. A portion of a top surface of the first conductive structure 1030 may contact the second conductive structure 1130, and the remainder of the top surface of the first conductive structure 1030 may contact the second insulating structure 1120, or more particularly may contact the first insulating layer 1114. That is, the second conductive structure 1130 contacts at least a portion of a top surface of the first conductive structure 1030. The second insulating layer 1116 may have a thickness greater than a thickness of the first insulating layer 1114. The first insulating layer 1114 may for example be formed of a nitride-based insulating material, and the second insulating layer 1116 may be formed of an oxide-based insulating material. The first insulating layer 1114 may be an etch stop layer. In other embodiments the first and second insulating layers 1114 and 1116 may be formed of other materials.

Of the top surface 1050s of the nucleation structure 50 of the first conductive structure 1030, the top end portions 50s1 and 50s2 having different heights to form the stepped top surface may be covered by the first insulating layer 1114 of the second insulating structure 1120. In the top surface 1050s of the nucleation structure 50 of the first conductive structure 1030, a top surface or top end portion 50s3 contacting the second conductive structure 1130 may be recessed further than the top end portions 50s1 and 50s2 forming the stepped top surface. Thus, in the top surface 1050s of the nucleation structure 50 of the first conductive structure 1030, the top end portion 50s3 contacting the second conductive structure 1130 may be lower than the top end portions 50s1 and 50s2 contacting the first insulating layer 1114 of the second insulating structure 1120. Thus, as described with reference to FIGS. 1 through 5D, the barrier structure 40 and the conductive pattern 60 contacting the first insulating layer 1114 may have coplanar top surfaces, and a portion of the nucleation structure 50 contacting the first insulating layer 1114 may have a stepped top surface. Also, of the stepped top surface of the nucleation structure 50, the top end portion 50s1 adjacent to the barrier structure 40 may be recessed further than the top end portion 50s2 adjacent to the conductive pattern 60, and the top end portion 50s3 of the nucleation structure 50 contacting the second conductive structure 1130 may have a top surface recessed further than the stepped top surface.

The first conductive structure 1030 may have a bar shape when viewed on a plane, and the second conductive structure 1130 may contact a portion of the first conductive structure 1030.

In an example embodiment such as described with respect to FIGS. 7A, 7B and 7C, the second conductive structure 1130 may be disposed so that portions of the nucleation structure 50 and the conductive pattern 60 of the first conductive structure 1030 that contact a bottom surface (lowermost) surface of the second conductive structure 1130 are recessed as compared with portions of the nucleation structure 50 and the conductive pattern 60 of the first conductive structure 1030 that do not contact the bottom surface of the second conductive structure 1130. The bottom (lowermost) surface of the second conductive structure 1130 as here described should be understood to mean the planar surface of the second conductive structure 1130 extending along the x and y directions that is in contact with the underlying first conductive structure 1030.

The inventive concept is not limited as described with respect to FIGS. 7A, 7B and 7C. Modified examples of the first and second conductive structures 1030 and 1130 will be described with reference to FIGS. 8A, 8B and 8C. Here, only modified portions of the first and second conductive structures 1030 and 1130 will be described, and corresponding similar structure previously described with reference to FIGS. 7A, 7B and 7C may be omitted from the following.

Referring to FIGS. 8A, 8B and 8C, the modified second conductive structure 1130' may be disposed so that portions of the barrier structure 40, the nucleation structure 50, and the conductive pattern 60 of the modified first conductive structure 1030' that contact a bottom (lowermost) surface of the modified second conductive structure 1130' are recessed as compared with portions of the barrier structure 40, the nucleation structure 50, and the conductive pattern 60 of the modified first conductive structure 1030' that do not contact the bottom surface of the second modified conductive structure 1130'. The bottom (lowermost) surface of the second modified conductive structure 1130' as here described should be understood to mean the planar surface of the second modified conductive structure 1130' extending along the x and y directions that is in contact with the underlying modified first conductive structure 1030'.

Examples of a method of forming a semiconductor device according to embodiment of the inventive concept will be described as follows. As an example, a method of forming the semiconductor device 1 shown in FIG. 1 will be described with reference to FIGS. 9, 10A, 10B and 10C.

Figure 9:
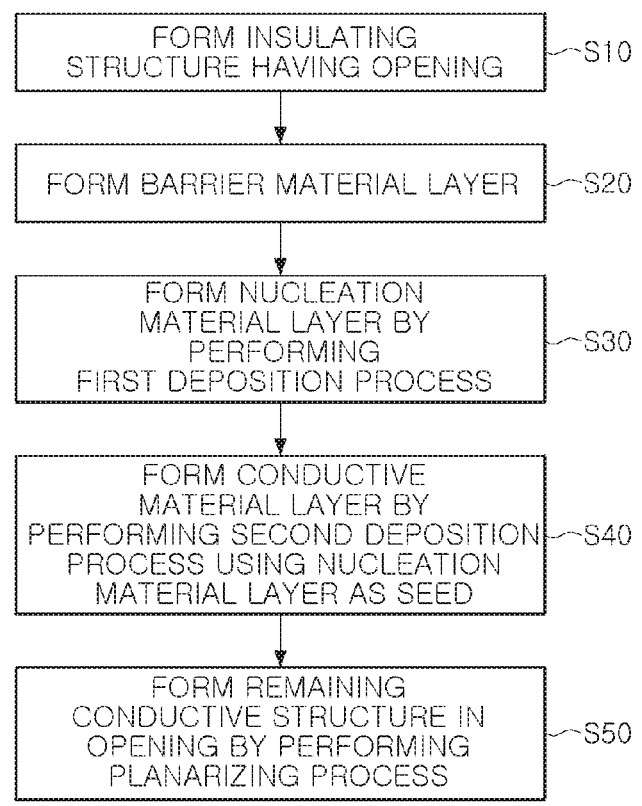
FIG. 9 illustrates a flow chart of a method of forming a semiconductor device according to an example embodiment of the inventive concept.
Figure 10A:
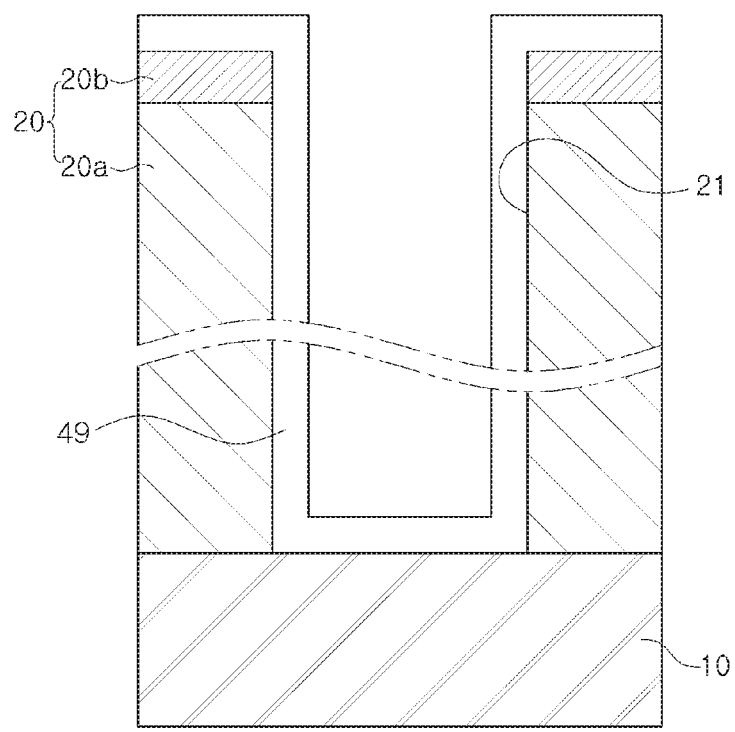
FIG. 10A illustrates a cross-sectional view of a method of forming a semiconductor device according to an example embodiment of the inventive concept.
Figure 10B:
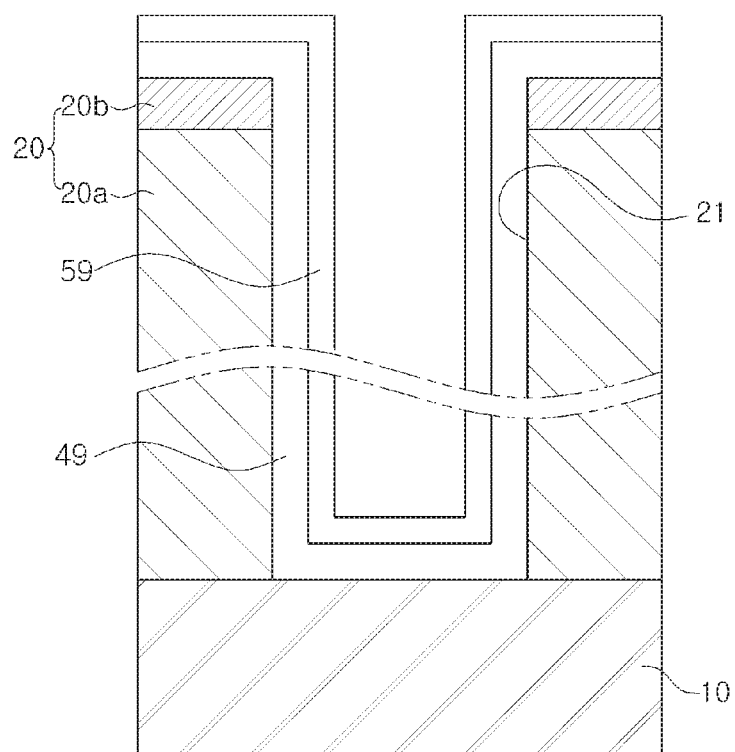
FIG. 10B illustrates a further cross-sectional view of a method of forming a semiconductor device described with respect to FIG. 10A.
Figure 10C:
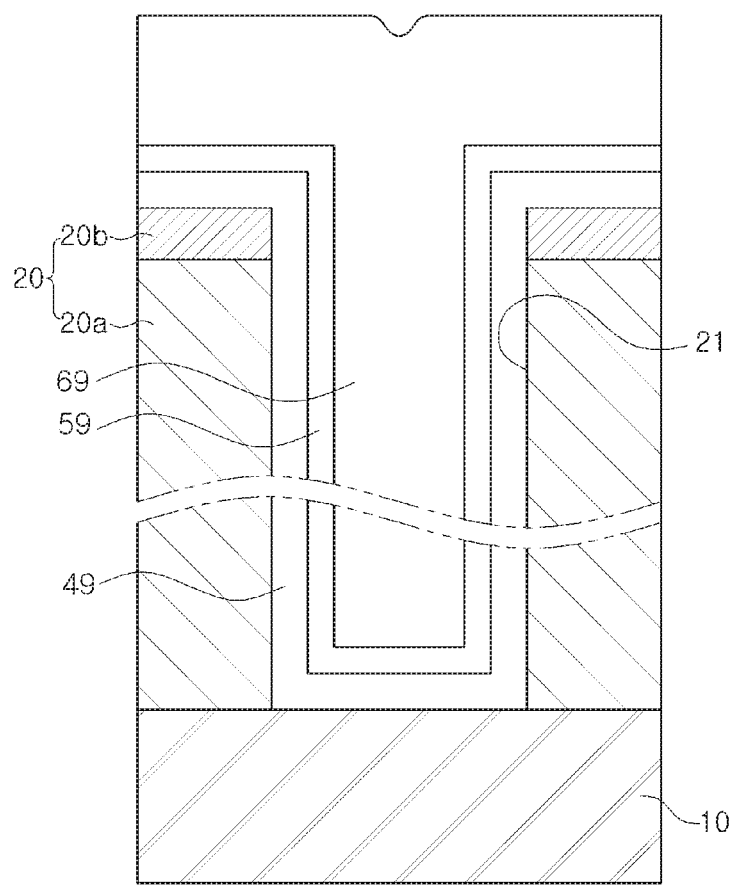
FIG. 10C illustrates a still further cross-sectional view of a method of forming a semiconductor device described with respect to FIG. 10A.

FIG. 9 illustrates a flow chart of a method of forming a semiconductor device according to an example embodiment of the inventive concept. FIGS. 10A, 10B, and 10C are cross-sectional views of a method of forming a semiconductor device according to an example embodiment of the inventive concept.

Referring to FIGS. 9 and 10A, an insulating structure 20 having an opening 21 is formed (S10). The insulating structure 20 includes an insulating layer 20a and an etch stop layer 20b disposed on the insulating layer 20a. The insulating layer 20a may for example be formed of a silicon oxide or a low-k dielectric having a dielectric constant lower than that of the silicon oxide. The etch stop layer 20b may be formed of a material different from that forming the insulating layer 20a, such as for example a silicon nitride. The insulating layer 20a and the etch stop layer 20b may be formed of other materials. The insulating structure 20 may be formed on or over a substrate 10. The substrate 10 may be a semiconductor substrate having a variety of components that may configure a semiconductor device. For example, the substrate 10 may be a semiconductor substrate including source/drain regions or a well contact region formed by doping a semiconductor material with an impurity.

A barrier material layer 49 is formed on the insulating structure 20 and on the substrate 10 within the opening 21 (S20). The barrier material layer 49 may be conformally formed on the insulating structure 20 having the opening 21. The forming of the barrier material layer 49 may include forming a first barrier layer such as titanium (Ti) or the like, and forming a second barrier layer such as titanium nitride (TiN) or the like on the first barrier layer.

In this specification, "forming conformally" may mean that a corresponding layer is formed to have a uniform thickness along a curve of a bottom or underlying structure.

Referring to FIGS. 9 and 10B, a nucleation material layer 59 is formed on the barrier material layer 49 by performing a first deposition process (S30). The first deposition process may be an ALD process using a first reducing material, a second reducing material, and a source material. The first reducing material may be $B_2H_4$ gas, the second reducing material may be $SiH_4$ gas or $GeH_4$ gas, and the source material may be $WF_6$ gas.

Referring to FIGS. 9 and 10C, a conductive material layer 69 is formed on the nucleation material layer 59 by performing a second deposition process using the nucleation material layer 59 as a seed (S40). The second deposition process may be a CVD process using a third reducing material and a source material. The third reducing material may be different from the first and second reducing materials used in the first deposition process for forming the nucleation material layer 59. For example, the third reducing material may be $H_2$ gas. The source material used in the second deposition process may be the same as the source material used in the first deposition process for forming the nucleation material layer 59. Thus, as with the source material used in the first deposition process, the source material used in the second deposition process may for example be $WF_6$ gas.

Referring to FIGS. 1 and 9, a conductive structure 30 remaining in the opening 21 is formed by performing a planarizing process (S50). The planarizing process may include planarizing the conductive material layer 69, the nucleation material layer 59, and the barrier material layer 49 such as shown in FIG. 10C until a top surface of the insulating structure 20 is exposed. The planarizing process may be performed using a chemical mechanical polishing (CMP) process. The planarizing process may expose the insulating layer 20a. Thus, the etch stop layer 20b disposed on the insulating layer 20a may be removed during or after the planarizing process. The conductive material layer 69, the nucleation material layer 59, and the barrier material layer 49 are thus planarized to respectively form conductive pattern 60, nucleation structure 50, and barrier structure 40 such as shown in FIG. 1. Thus, the conductive structure 30 remaining in the opening 21 may include the conductive pattern 60, the nucleation structure 50, and the barrier structure 40.

A portion of a top surface of the nucleation structure 50 may be recessed further than top surfaces of the conductive pattern 60 and the barrier structure 40 by the planarizing process performed using the CMP process. Thus, the nucleation structure 50 may have a stepped top surface 50s formed using the CMP process. In particular, the polishing rate of the first nucleation layer 52 shown in FIG. 2 for example during the CMP process may be greater than the polishing rate of the second nucleation layer 58 during the CMP process, resulting in the top surface 50s1 of the first nucleation layer 52 being recessed further than the top surface 50s2 of the second nucleation layer 58.

The nucleation structure 50 may be formed as one of the nucleation structures 50 described with reference to FIGS. 2 and 5A through 5D. As described above, in order to form one of the nucleation structures 50 described with reference to FIGS. 2 and 5A through 5D as described above, the nucleation material layer 59 of FIG. 10B may be formed by performing the first deposition process as described with reference to FIGS. 9 and 10B. A method of forming the nucleation material layer 59 of FIG. 10B by performing the first deposition process will be described with reference to FIG. 11.

Figure 11:
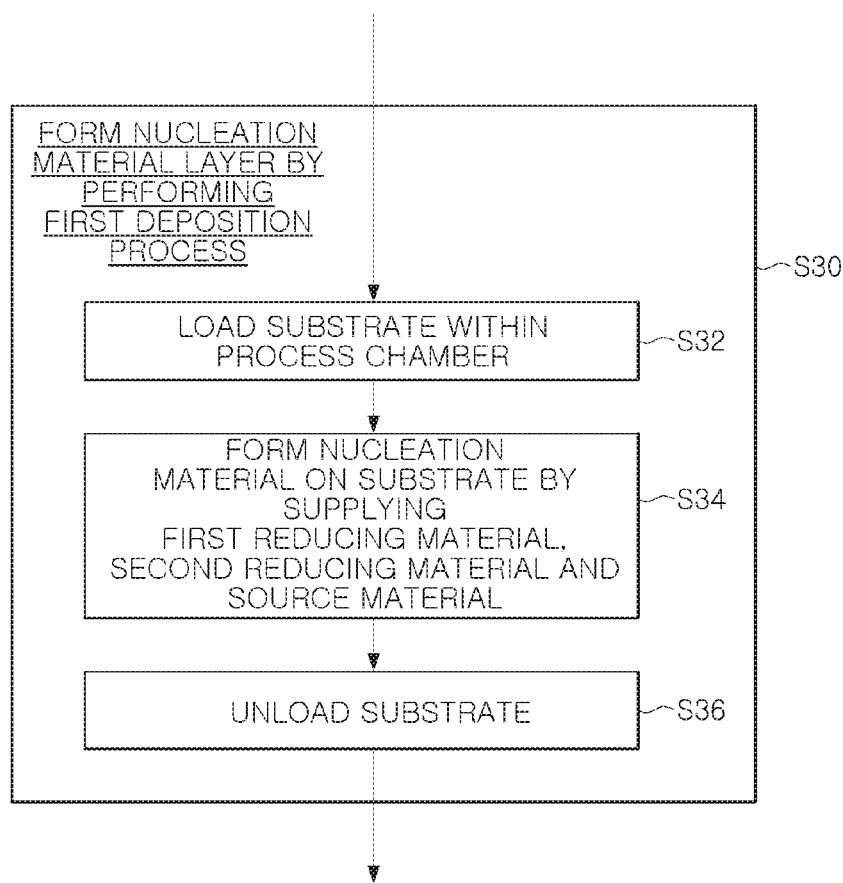
FIG. 11 illustrates a flow chart of a method of forming a semiconductor device according to an example embodiment of the inventive concept.

FIG. 11 illustrates a flow chart of a method of forming a semiconductor device according to an example embodiment of the inventive concept.

Referring first to FIGS. 9, 10B, and 11, the nucleation material layer 59 of FIG. 10B may be formed by performing the first deposition process (S30). The first deposition process may proceed as follows.

A substrate is loaded into a process chamber (S32). The substrate may be a semiconductor substrate including the barrier material layer 49 thereon as illustrated in FIG. 10A. The barrier material layer 49 (refer to FIG. 10A) of the substrate may be in an exposed state. The process chamber may be part of typical ALD process equipment. Subsequently, the nucleation material layer 59 of FIG. 10B is formed on the substrate by supplying a first reducing material, a second reducing material, and a source material to the process chamber (S34). The nucleation material layer 59 of FIG. 10B may be in direct contact with the barrier material layer 49. The substrate may be unloaded (S36).

The nucleation material layer 59 of FIG. 10B may be formed as one of the nucleation structures 50 described with reference to FIGS. 2 and 5A through 5D by the operation (S34) of forming the nucleation material layer 59 of FIG. 10B on the substrate by supplying the first reducing material, the second reducing material, and the source material to the process chamber in the first deposition process. Hereinafter, various examples of the operation (S34) of forming the nucleation material layer 59 of FIG. 10B as one of the nucleation structures 50 described with reference to FIGS. 2 and 5A through 5D will be described with reference to FIGS. 12A through 12F.

FIGS. 12A through 12F illustrate gas pulsing diagrams of various respective examples of methods of forming a semiconductor device according to embodiments of the inventive concept.

The forming of the nucleation material layer 59 of FIG. 10B may include supplying one of first and second reducing materials to a process chamber in a pulsed manner, and repeating one cycle in which a source material is supplied to the process chamber in a pulsed manner. During a time between the supplying of the first and second reducing materials and the source material in the pulsed manner, purging may be performed in the process chamber. Thus, the one cycle may include supplying one of the first and second reducing materials in the pulsed manner, purging the supplied one of the first and second reducing materials, supplying the source material in the pulsed manner, and purging the supplied source material before a subsequent one cycle is performed. Hereinafter, the one cycle may also be understood as a unit process. Thus, the term "unit process" used below may also be replaced with the term "one cycle."

In some example embodiments of the inventive concept, of the first and second reducing materials used in the process of forming the nucleation material layer 59 of FIG. 10B, one reducing material, having relatively low Gibbs free energy (ΔG) with respect to the source material may be supplied to the process chamber first, and the other reducing material having relatively high Gibbs free energy (ΔG) with respect to the source material may be supplied to the process chamber last. In some example embodiments of the inventive concept, the one reducing material having relatively low Gibbs free energy (ΔG) with respect to the source material may be the first reducing material, and the other reducing material having relatively high Gibbs free energy (ΔG) with respect to the source material may be the second reducing material. Thus, the first reducing material may have Gibbs free energy (ΔG) lower than that of the second reducing material, with respect to the source material. For example, the first reducing material may be $B_2H_4$ gas, the second reducing material may be $SiH_4$ gas or $GeH_4$ gas, and the source material may be $WF_6$ gas.

The method of forming the nucleation material layer 59 of FIG. 10B as the nucleation structure 50 described with reference to FIG. 2 will be described with reference to FIGS. 2, 9, 10B, and 12A.

Referring to FIGS. 2, 9, 10B, and 12A, the forming of the nucleation material layer 59 of FIG. 10B may include performing an initial unit process C_INI, performing an intermediate process C_M, and a final unit process C_F.

The initial unit process C_INI includes supplying a first reducing material and a source material to the process chamber sequentially. The initial unit process C_INI may include purging during a time between the supplies of the first reducing material and the source reducing material, and purging after the supply of the source material in a pulsed manner. Thus, the initial unit process C_INI includes sequentially supplying the first reducing material to the process chamber for a period of time or in a pulsed manner, purging the supplied first reducing material while stopping the supply of the first reducing material, supplying the source material to the process chamber for a period of time or in a pulsed manner, and purging the supplied source material while stopping the supply of the source material.

A nucleation material formed using the initial unit process C_INI may be referred to as a "first nucleation material".

In an example embodiment of the inventive concept, the intermediate process C_M includes performing a plurality of intermediate unit processes C_Mb. Each of the intermediate unit processes C_Mb includes sequentially supplying the first reducing material to the process chamber in a pulsed manner, purging the supplied first reducing material while stopping the supply of the first reducing material, supplying the source material to the process chamber in a pulsed manner, and purging the supplied source material while stopping the supply of the source material. The intermediate unit processes C_Mb of the intermediate process C_M may be performed under the same process conditions as those of the initial unit process C_INI. Thus, the intermediate unit processes C_Mb may form the first nucleation material as in the initial unit process C_INI.

In this specification, the initial unit process C_INI may be referred to as an "initial cycle," the intermediate unit processes C_Mb may be referred to as "intermediate cycles," and the final unit process C_F may be referred to as a "final cycle."

The final unit process C_F includes sequentially supplying the second reducing material to the process chamber for a period of time or in a pulsed manner, purging the supplied second reducing material while stopping the supply of the second reducing material, supplying the source material to the process chamber for a period of time or in a pulsed manner, and purging the supplied source material while stopping the supply of the source material. The first reducing material may include $B_2H_4$ gas. The second reducing material may include $SiH_4$ gas or $GeH_4$ gas. The source material may include $WF_6$ gas. The final unit process C_F may form the second nucleation material.

Of the first and second reducing materials, the first reducing material having relatively low Gibbs free energy (ΔG) with respect to the source material is supplied first to the process chamber to form first the first nucleation material, thereby significantly reducing or preventing a volcano effect that may occur due to volatile $TiF_3$ formed by a reaction between $F^-$ of the $WF_6$ gas and titanium (Ti) of the barrier structure 40 formed of a titanium (Ti)/titanium nitride (TiN) material. The first nucleation material may be less influenced by a material type or characteristic of the barrier structure 40 than the second nucleation material, and thus the first nucleation material may be deposited or formed on the barrier structure 40 to have a thickness that is more uniform than that of the second nucleation material. That is, although the second nucleation material is not deposited on the barrier structure 40 and does not have a thickness that is more uniform than that of the first nucleation material, the second nucleation material may be deposited on the first nucleation material to have a uniform thickness.

The first nucleation material may be amorphous, and the second nucleation material may be crystalline. The conductive material layer 69 of FIG. 10C formed after forming the nucleation material layer 59 may be crystalline and may have a grain size greater than that of the second nucleation material of the nucleation material layer 59, as described with reference to the grain size in FIG. 3.

The nucleation material layer 59 may include a first impurity element and a second impurity element. As described with reference to the distribution characteristics of the first and second impurity elements in FIG. 4, in the nucleation material layer 59, the concentration of the first impurity element in the first nucleation material may be higher than the concentration of the first impurity element in the second nucleation material, and the concentration of the second impurity element in the second nucleation material may be higher than the concentration of the second impurity element in the first nucleation material. The first impurity element may be boron (B), and the second impurity element may be fluorine (F).

In another example embodiment of the inventive concept, the intermediate unit processes C_Mb of the intermediate process C_M immediately before performing the final unit process C_F is performed under the same process conditions as those of the final unit process C_F. Thus, as illustrated in FIG. 12B, the intermediate process C_M includes sequentially first intermediate unit processes C_Mb performed under the same process conditions as those of the initial unit process C_INI, and a second intermediate unit process C_Ms performed under the same process conditions as those of the final unit process C_F. More generally, the intermediate process C_M may be characterized as including a first intermediate unit process (such as C_Mb) that includes supplying one of the first reducing material and the second reducing material, and the source material, to the process chamber sequentially; and a second intermediate unit process (such as C_Ms) that includes supplying an other one of the first reducing material and the second reducing material, and the source material, to the process chamber sequentially.

The thickness of the first nucleation material in the nucleation material layer 59 may be determined according to the number of repetitions of the first intermediate unit processes C_Mb in the intermediate process C_M performed under the same process conditions as those of the initial unit process C_INI. The thickness of the second nucleation material in the nucleation material layer 59 may also be determined according to the number of repetitions of the second intermediate unit process C_Ms in the intermediate process C_M performed under the same process conditions as those of the final unit process C_F. In an example embodiment, the first nucleation material may have a thickness greater than that of the second nucleation material similar as shown in FIG. 2 wherein the thickness t1 of the first nucleation layer 52 is greater than the thickness t2 of the second nucleation layer 58.

The first nucleation material may be formed as the first nucleation layer 52 of FIG. 2, and the second nucleation material may be formed as the second nucleation layer 58 of FIG. 2. Thus, the first and second nucleation materials of the first and second nucleation layers 52 and 58 have been described with reference to FIGS. 1 and 2, and thus detailed descriptions thereof will be omitted hereinafter.

An example of a method of forming the nucleation structure 50 described with reference to FIG. 5A will be described with reference to FIGS. 5A, 9, 10B, and 12C.

Figure 12A:
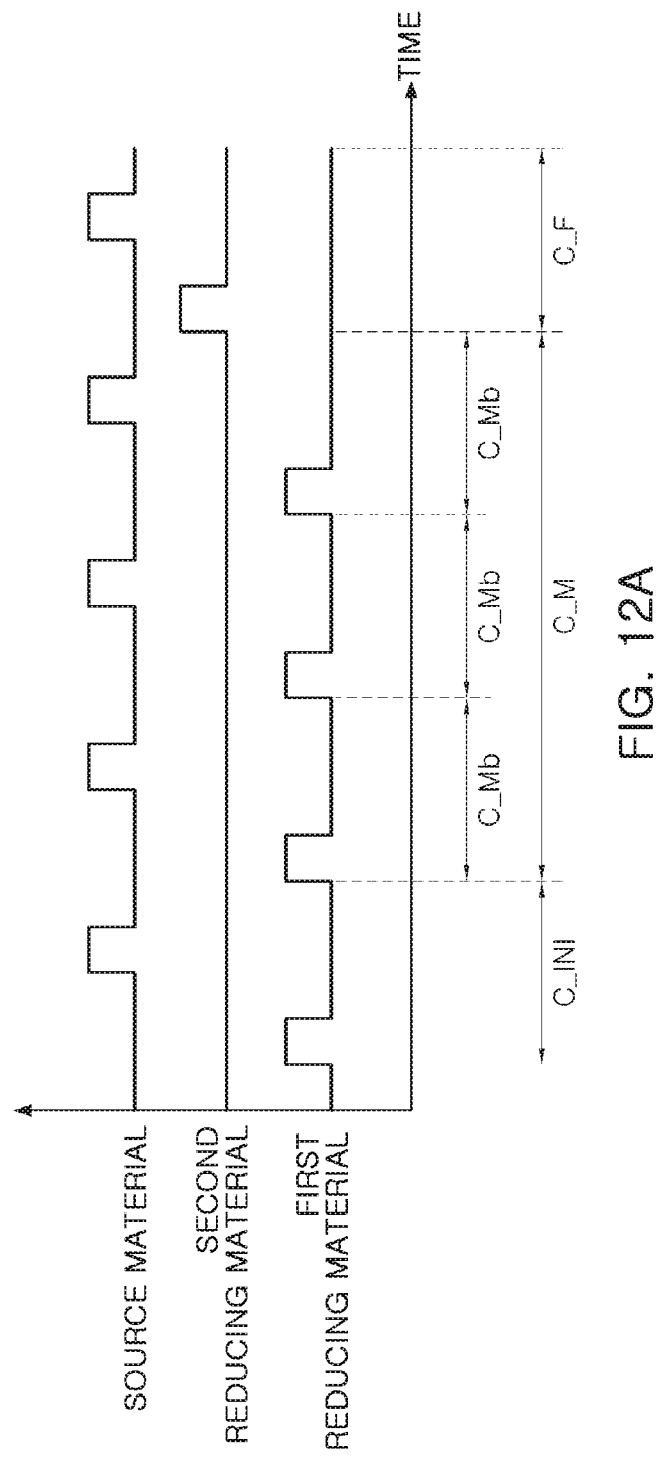
FIG. 12A illustrates a gas pulsing diagram illustrating an example of a method of forming a semiconductor device according to an example embodiment of the inventive concept.
Figure 12B:
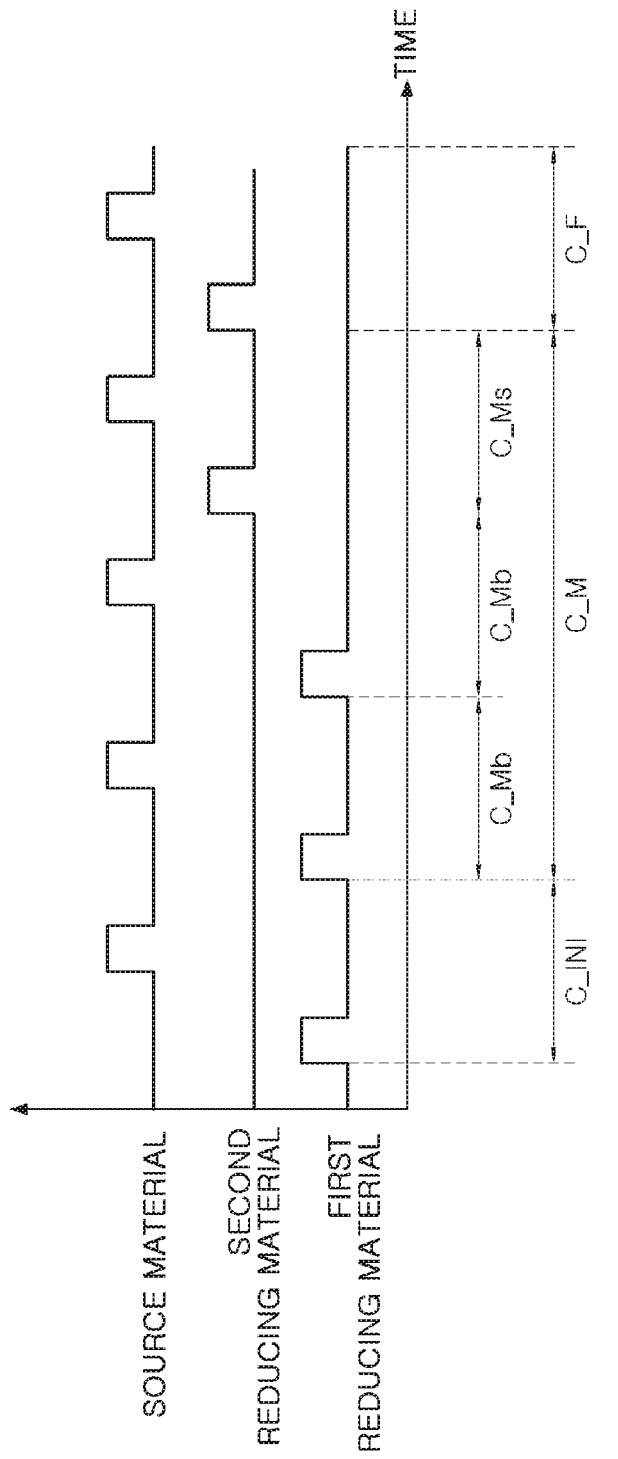
FIG. 12B illustrates a gas pulsing diagram illustrating another example of a method of forming a semiconductor device according to an example embodiment of the inventive concept.
Figure 12C:
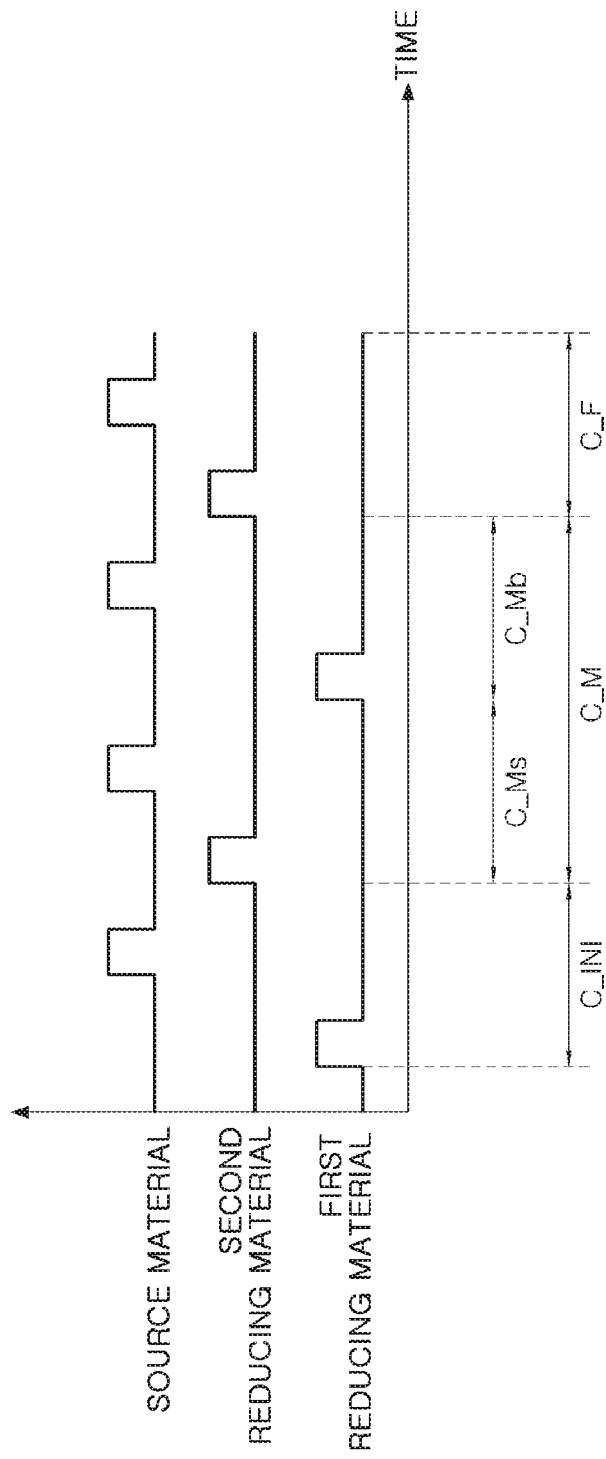
FIG. 12C illustrates a gas pulsing diagram illustrating another example of a method of forming a semiconductor device according to an example embodiment of the inventive concept.

Referring to FIGS. 5A, 9, 10B, and 12C, the forming of the nucleation material layer 59 of FIG. 10B includes performing an initial unit process C_INI and a final unit process C_F the same as those illustrated in FIG. 12A.

An intermediate process C_M is performed between the initial unit process C_INI and the final unit process C_F. The intermediate process C_M includes performing sequentially the second intermediate unit process C_Ms and the first intermediate unit process C_Mb such as described with respect to FIG. 12B. The second intermediate unit process C_Ms may be performed under the same process conditions as those of the final unit process C_F, and the first intermediate unit process C_Mb may be performed under the same process conditions as those of the initial unit process C_INI. Thus, the second intermediate unit process C_Ms and the final unit process C_F may form the second nucleation material (corresponding to the nucleation layers 54 and 58 shown in FIG. 5A for example), and the first intermediate unit process C_Mb and the initial unit process C_INI may form the first nucleation material (corresponding to the nucleation layers 52a and 56 shown in FIG. 5A for example). Thus, the first and second nucleation materials in the nucleation material layer 59 of FIG. 10B may be formed alternately and repeatedly. The nucleation material layer 59 of FIG. 10B may be formed as the nucleation structure 50 illustrated in FIG. 5A.

Figure 12D:
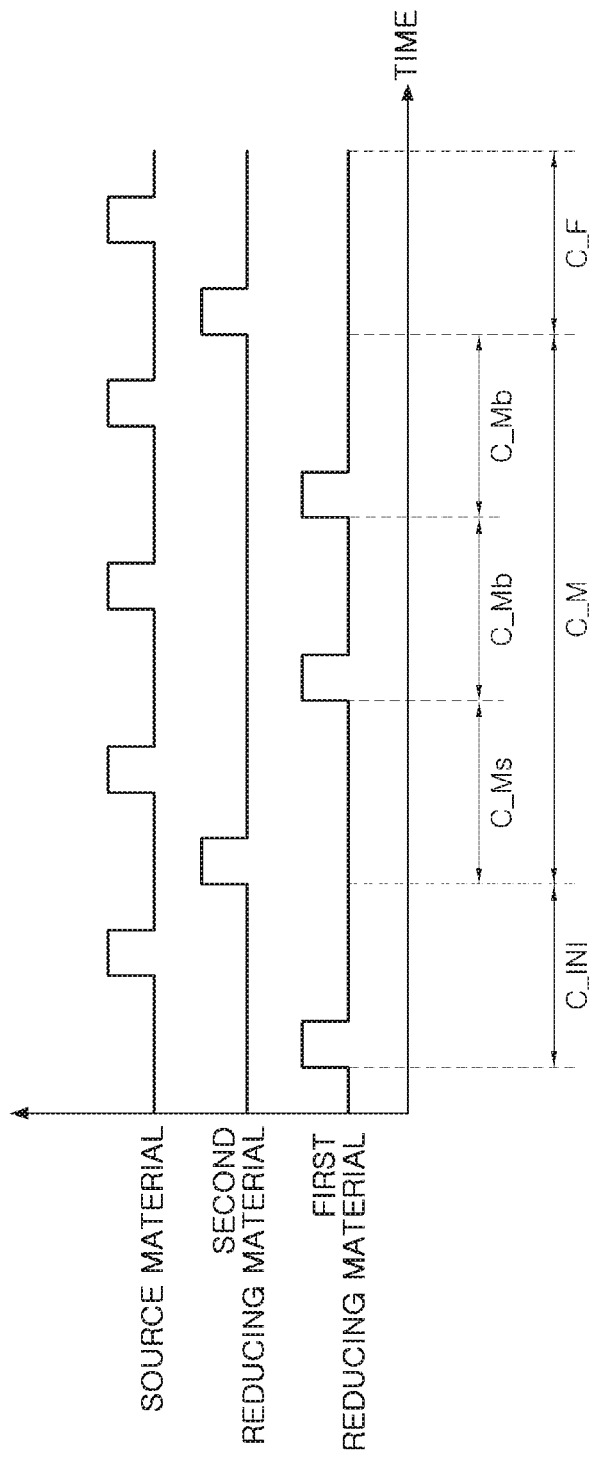
FIG. 12D illustrates a gas pulsing diagram illustrating another example of a method of forming a semiconductor device according to an example embodiment of the inventive concept.

In a modified example, in order to form the nucleation structure 50 illustrated in FIG. 5B, the number of repetitions of the first intermediate unit processes C_Mb in the intermediate process C_M may be increased, as illustrated in FIG. 12D. Thus, the nucleation structure 50 of FIG. 5B may be formed including the first nucleation layer 52a of FIG. 5B, the first intermediate nucleation layer 54 of FIG. 5B, the second intermediate nucleation layer 56' formed to have an increased thickness by increasing the number of repetitions of the first intermediate unit processes C_Mb, and the second nucleation layer 58 of FIG. 5B.

Figure 12E:
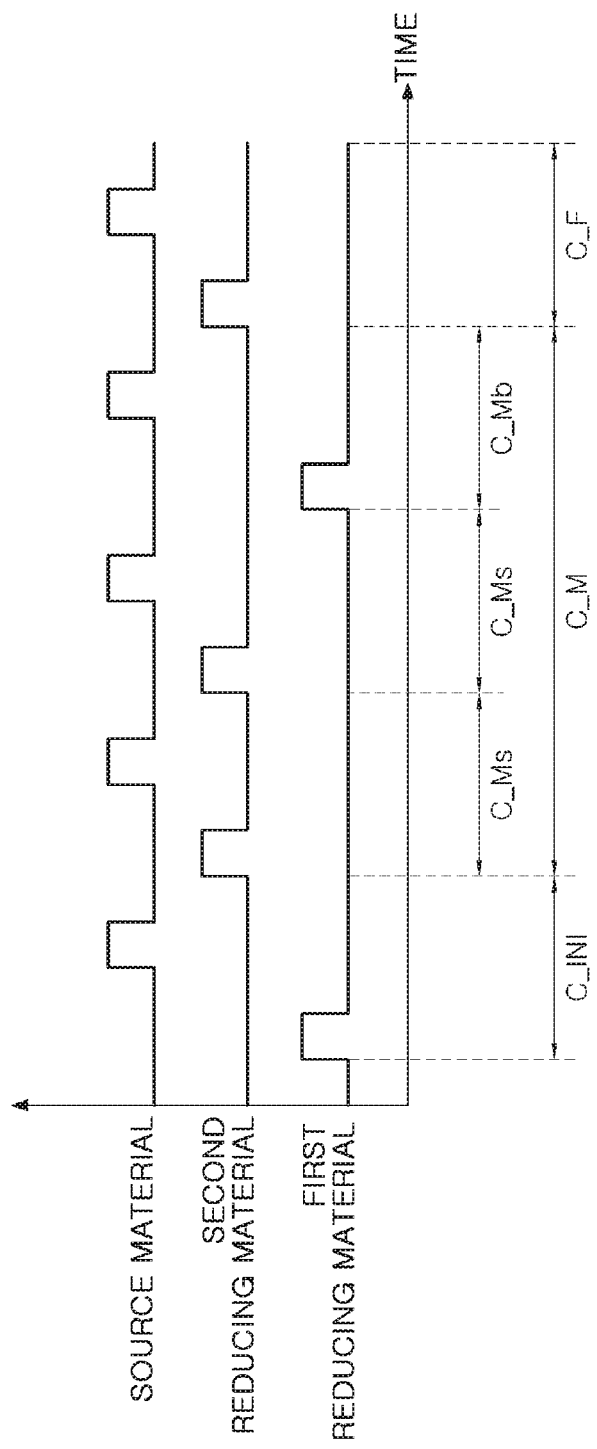
FIG. 12E illustrates a gas pulsing diagram illustrating another example of a method of forming a semiconductor device according to an example embodiment of the inventive concept.

In a modified example, in order to form the nucleation structure 50 illustrated in FIG. 5C, the number of repetitions of the second intermediate unit processes C_Ms in the intermediate process C_M may be increased, as illustrated in FIG. 12E. Thus, the increase in the number of repetitions of the second intermediate unit processes C_Ms as illustrated in FIG. 12E results in the thickness of the second nucleation material formed using the intermediate process C_M to be increased. Thus, the nucleation structure 50 of FIG. 5C may be formed, including the first nucleation layer 52a of FIG. 5C, the first intermediate nucleation layer 54' of FIG. 5C formed to have an increased thickness by increasing the number of repetitions of the second intermediate unit processes C_Ms, the second intermediate nucleation layer 56 of FIG. 5C, and the second nucleation layer 58 of FIG. 5C.

Figure 12F:
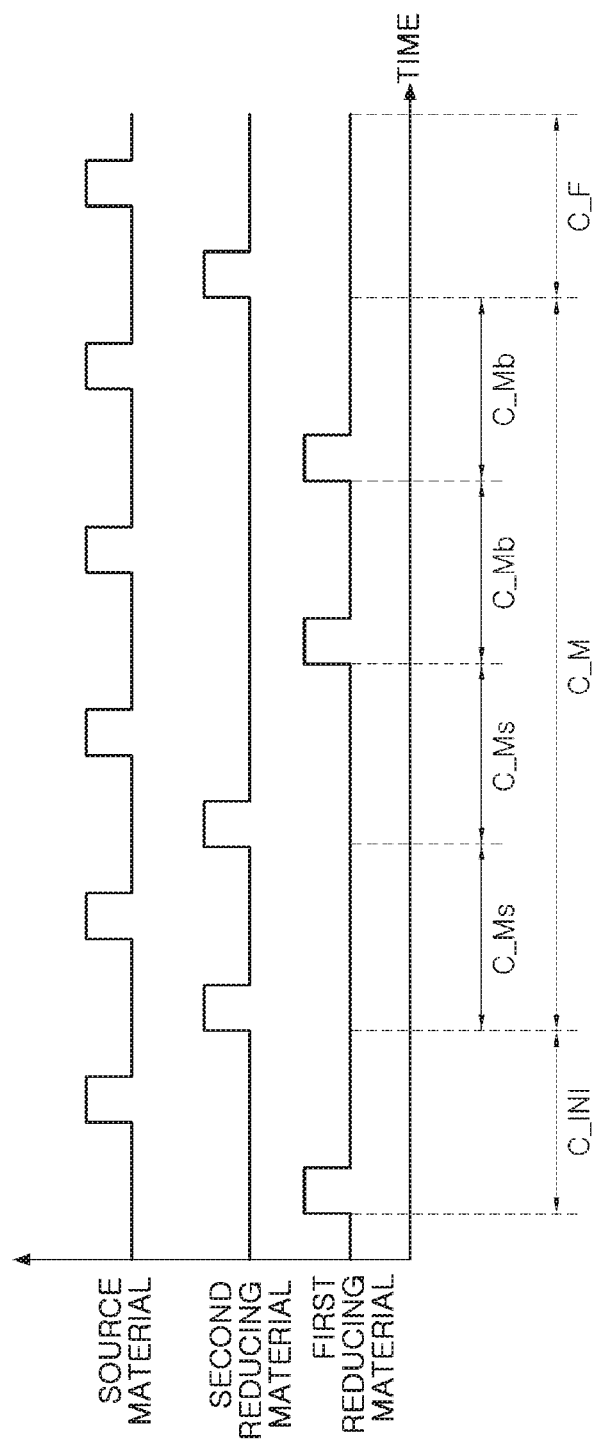
FIG. 12F illustrates a gas pulsing diagram illustrating another example of a method of forming a semiconductor device according to an example embodiment of the inventive concept.

In a modified example, in order to form the nucleation structure 50 illustrated in FIG. 5D, the number of repetitions of the second intermediate unit processes C_Ms and the number of repetitions of the first intermediate unit processes C_Mb in the intermediate process C_M may be increased, as illustrated in FIG. 12F. Thus, the nucleation structure 50 of FIG. 5D may be formed, including the first nucleation layer 52a of FIG. 5D, the first intermediate nucleation layer 54' of FIG. 5D formed to have an increased thickness by increasing the number of repetitions of the second intermediate unit processes C_Ms, the second intermediate nucleation layer 56' of FIG. 5D formed to have an increased thickness by increasing the number of repetitions of the first intermediate unit processes C_Mb, and the second nucleation layer 58 of FIG. 5D.

As described above, the conductive structure 30 may include the conductive pattern 60 formed of a bulk tungsten (W) material, the barrier structure 40 covering the bottom (lowermost) surface and the lateral surfaces of the conductive pattern 60, and the nucleation structure 50 disposed between the barrier structure 40 and the conductive pattern 60.

The nucleation structure 50 may include the first nucleation layer 52 formed of the first nucleation material, and the second nucleation layer 58 formed of the second nucleation material. The first nucleation material contacting the barrier structure 40 may significantly reduce or prevent a volcano effect that may occur in a contact plug or the like. The second nucleation material contacting the conductive pattern 60 may cover an upper lateral surface of the conductive pattern 60 to thus protect the conductive pattern 60 from a planarizing process such as a CMP used to form the conductive structure 30.

In further embodiments of the inventive concept, the nucleation structure 50 may include any number (plurality) of intermediate nucleation layers (such as first and second intermediate nucleation layers 54 and 56 in FIG. 5A) between the first nucleation layer 52 and the second nucleation layer 58. At least one of the intermediate nucleation layers may include (be formed of) the second nucleation material previously described, and a remainder of the intermediate nucleation materials may include (be formed of) the first nucleation material previously described. In further embodiments of the inventive concept, at least one of the intermediate nucleation layers (such as first and second intermediate nucleation layers 54 and 56 in FIG. 5A) and the first nucleation layer 52 may include (be formed of) the (same) first nucleation material previously described, and a remainder of the intermediate nucleation layers and the second nucleation material 58 may include (be formed of) the (same) second nucleation material previously described.

As set forth above, according to example embodiments of the inventive concept, a semiconductor device including a conductive structure having a nucleation structure may be provided. The occurrence of defects in the conductive structure may be significantly reduced or suppressed by forming the nucleation structure using first and second nucleation materials having different characteristics. Further, electrical characteristics of the conductive structure may be improved. Thus, the occurrence of defects in the semiconductor device may be significantly reduced or suppressed, and performance of the semiconductor device may be improved.

The foregoing is illustrative of embodiments of the inventive concept with reference to the accompanying drawings. Although a number of embodiments have been described, those of ordinary skill in the art will readily understand that many modifications are possible in embodiments without materially departing from the novel teachings and advantages. Therefore, it is to be understood that the foregoing is illustrative of various embodiments and is not to be construed as limited to the specific embodiments disclosed.

What is claimed is:

1. A semiconductor device comprising:
a substrate;
a plurality of fins disposed on the substrate and including a first fin and a second fin;
an isolation layer disposed on the substrate and disposed between the first fin and the second fin;
a gate disposed on the plurality of fins and on the isolation layer, and including a gate electrode and a gate dielectric covering side surfaces and a bottom surface of the gate electrode;
a plurality of source/drains including a first source/drain disposed on the first fin and a second source/drain disposed on the second fin; and
a contact plug disposed on the plurality of source/drains and including a first layer and a second layer covering side surfaces of the first layer,
wherein the second layer includes a first portion covering the side surfaces of the first layer, and a second portion covering side surfaces of the first portion,
the first portion of the second layer of the contact plug is disposed between the first layer of the contact plug and the second portion of the second layer of the contact plug, and
a top surface of the second portion of the second layer of the contact plug is recessed.

2. The semiconductor device of claim 1, wherein the contact plug includes a third layer covering side surfaces of the second layer.

3. The semiconductor device of claim 1, wherein the second layer of the contact plug includes tungsten (W).

4. The semiconductor device of claim 1, wherein a thickness of the second portion of the second layer of the contact plug is different from a thickness of the first portion of the second layer of the contact plug.

5. The semiconductor device of claim 1, wherein a thickness of the second portion of the second layer of the contact plug is the same as a thickness of the first portion of the second layer of the contact plug.

6. The semiconductor device of claim 1, wherein the second layer includes a third portion covering side surfaces of the second portion,
a thickness of the second portion of the second layer is different from a thickness of the third portion of the second layer, and
the first portion and the third portion of the second layer of the contact plug are formed of the same material.

7. The semiconductor device of claim 1, wherein the second layer includes a third portion covering side surfaces of the second portion,
a thickness of the second portion of the second layer is the same as a thickness of the third portion of the second layer, and
a top surface of the third portion of the second layer of the contact plug is recessed.

8. The semiconductor device of claim 1, wherein the second layer includes a third portion covering side surfaces of the second portion and a fourth portion covering side surfaces of the third portion,
a top surface of the third portion of the second layer of the contact plug and a top surface of the fourth portion of the second layer of the contact plug are recessed,
the first portion and the third portion of the second layer of the contact plug are formed of the same material, and
the second portion and the fourth portion of the second layer of the contact plug are formed of the same material.

9. A semiconductor device comprising:
a substrate;
a plurality of fins disposed on the substrate and including a first fin and a second fin;
an isolation layer disposed on the substrate and disposed between the first fin and the second fin;
a gate disposed on the plurality of fins and on the isolation layer, and including a gate electrode and a gate dielectric covering side surfaces and a bottom surface of the gate electrode;
a plurality of source/drains including a first source/drain disposed on the first fin and a second source/drain disposed on the second fin; and
a contact plug disposed on the plurality of source/drains and including a first layer and a second layer covering side surfaces of the first layer,
wherein the second layer includes a first portion, a second portion covering side surfaces of the first portion, and a third portion covering side surfaces of the second portion, a thickness of the second portion of the second layer of the contact plug is different from a thickness of the third portion of the second layer of the contact plug, and a top surface of the second portion of the second layer of the contact plug is recessed.

10. The semiconductor device of claim 9, wherein the thickness of the second portion of the second layer of the contact plug is greater than the thickness of the third portion of the second layer of the contact plug.

11. The semiconductor device of claim 9, wherein the thickness of the second portion of the second layer of the contact plug is less than the thickness of the third portion of the second layer of the contact plug.

12. The semiconductor device of claim 9, wherein the thickness of the second portion of the second layer of the contact plug is the same as a thickness of the first portion of the second layer of the contact plug.

13. The semiconductor device of claim 9, wherein the thickness of the second portion of the second layer of the contact plug is different from a thickness of the first portion of the second layer of the contact plug.

14. The semiconductor device of claim 9, wherein the second portion of the second layer of the contact plug is formed of a material different from a material of which the third portion of the second layer of the contact plug is formed.

15. The semiconductor device of claim 9, wherein the second layer of the contact plug includes tungsten (W).

16. The semiconductor device of claim 9, wherein a top surface of the first portion of the second layer of the contact plug is higher than the top surface of the second portion of the second layer of the contact plug.

17. The semiconductor device of claim 9, wherein a top surface of the third portion of the second layer of the contact plug is higher than the top surface of the second portion of the second layer of the contact plug.

18. A semiconductor device comprising:

a substrate;

a plurality of fins disposed on the substrate and including a first fin and a second fin;

an isolation layer disposed on the substrate and disposed between the first fin and the second fin;

a gate disposed on the plurality of fins and on the isolation layer, and including a gate electrode and a gate dielectric covering side surfaces and a bottom surface of the gate electrode;

a plurality of source/drains including a first source/drain disposed on the first fin and a second source/drain disposed on the second fin; and a contact plug disposed on the plurality of source/drains and including a first layer, a second layer covering side surfaces of the first layer, and a third layer covering side surfaces of the second layer, wherein the second layer includes a first portion and a second portion covering side surfaces of the first portion, a thickness of the second portion of the second layer of the contact plug is different from a thickness of the first portion of the second layer of the contact plug, and a top surface of the second portion of the second layer of the contact plug is recessed.

19. The semiconductor device of claim 18, wherein the second layer further includes a third portion covering side surfaces of the second portion, and a fourth portion covering side surfaces of the third portion, and a top surface of the third portion of the second layer of the contact plug and a top surface of the fourth portion of the second layer of the contact plug are recessed.

20. The semiconductor device of claim 18, wherein the second portion of the second layer of the contact plug is formed of a material different from a material of which the first portion of the second layer of the contact plug is formed.

* * * * *